US012525953B2

(12) United States Patent
Han et al.

(10) Patent No.: US 12,525,953 B2
(45) Date of Patent: Jan. 13, 2026

(54) BULK ACOUSTIC RESONATOR

(71) Applicant: SAMSUNG ELECTRO-MECHANICS CO., LTD., Suwon-si (KR)

(72) Inventors: Won Han, Suwon-si (KR); Sang Uk Son, Suwon-si (KR); Jong Woon Kim, Suwon-si (KR); Sungwook Kim, Suwon-si (KR); Jeong Hoon Ryou, Suwon-si (KR); Daehun Jeong, Suwon-si (KR); Jung-Eun Youm, Suwon-si (KR); Sangheon Han, Suwon-si (KR); Jeonga Kim, Suwon-si (KR); Hwasun Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 161 days.

(21) Appl. No.: 18/584,444

(22) Filed: Feb. 22, 2024

(65) Prior Publication Data
US 2024/0356524 A1  Oct. 24, 2024

(30) Foreign Application Priority Data
Apr. 18, 2023  (KR) .................. 10-2023-0050947

(51) Int. Cl.
*H03H 9/17* (2006.01)
*H03H 9/02* (2006.01)

(52) U.S. Cl.
CPC ........ *H03H 9/173* (2013.01); *H03H 9/02118* (2013.01); *H03H 9/02157* (2013.01)

(58) Field of Classification Search
CPC .............. H03H 9/02118; H03H 9/132; H03H 9/02157; H03H 9/173
See application file for complete search history.

(56) References Cited

U.S. PATENT DOCUMENTS 9,571,063 B2 * 2/2017 Burak .................. H03H 9/54
2009/0206706 A1 8/2009 Iwaki et al.
(Continued)

FOREIGN PATENT DOCUMENTS

KR  10-2020-0073968 A  6/2020
KR  10-2022-0048689 A  4/2022
(Continued)

OTHER PUBLICATIONS

Korean Notice of Allowance Issued on Apr. 25, 2025, in Counterpart Korean Patent Application No. 10-2023-0050947 (2 Pages in English, 2 Pages in Korean).

(Continued)

*Primary Examiner* — Quan Tra
(74) *Attorney, Agent, or Firm* — NSIP Law

(57) ABSTRACT

A bulk acoustic resonator includes a resonance portion including a first electrode, a piezoelectric layer disposed on the first electrode along a height direction, and a second electrode disposed on the piezoelectric layer along the height direction. The resonance portion includes an overlapping region in which the first electrode, the piezoelectric layer, and the second electrode overlap each other along the height direction. The overlapping region includes a central portion and an edge portion disposed outside the central portion, and including a first edge portion and a second edge portion. A height of the second electrode of the first edge portion and a height of the second electrode of the second edge portion are lower than a height of the second electrode of the central portion along the height direction, and are different from each other along the height direction.

30 Claims, 29 Drawing Sheets

(56) References Cited

U.S. PATENT DOCUMENTS

| | | | |
|---|---|---|---|
| 2017/0033769 A1* | 2/2017 | Yokoyama | H03H 9/02118 |
| 2018/0204996 A1 | 7/2018 | Zou et al. | |
| 2020/0099359 A1* | 3/2020 | Shin | H03H 9/0561 |
| 2020/0195223 A1 | 6/2020 | Kim et al. | |
| 2022/0116016 A1 | 4/2022 | Han et al. | |
| 2022/0385268 A1 | 12/2022 | Moon et al. | |
| 2023/0006643 A1 | 1/2023 | Choi et al. | |
| 2023/0109382 A1* | 4/2023 | Liu | H03H 9/02157 |
| | | | 333/187 |

FOREIGN PATENT DOCUMENTS

| | | |
|---|---|---|
| KR | 10-2022-0161680 A | 12/2022 |
| KR | 10-2023-0005483 A | 1/2023 |

OTHER PUBLICATIONS

Korean Office Action issued on Aug. 29, 2024, in counterpart Korean Patent Application No. 10-2023-0050947 (8 pages in English, 8 pages in Korean).

Hashimoto, Ken-ya. "RF bulk acoustic wave filters for communications". *Artech House*, 2009. pp. 1-292.

Thalhammer, Robert, et al. "4E-3 spurious mode suppression in BAW resonators." *2006 IEEE Ultrasonics Symposium*. IEEE, Apr. 16, 2007. pp. 1-4.

\* cited by examiner

BULK ACOUSTIC RESONATOR

CROSS-REFERENCE TO RELATED APPLICATIONS

This application claims the benefit under 35 USC 119(a) of Korean Patent Application No. 10-2023-0050947 filed on Apr. 18, 2023, in the Korean Intellectual Property Office, the entire disclosure of which is incorporated herein by reference for all purposes.

BACKGROUND

1. Field

The present disclosure relates to a bulk acoustic resonator.

2. Description of the Background

With rapid development of a mobile communication device, a chemical device, a bio device, and the like, demand for a small lightweight filter, an oscillator, a resonance element, an acoustic resonant mass sensor, and the like used in these devices is recently increasing.

An acoustic resonator such as a bulk acoustic wave (BAW) filter may be used as the small lightweight filter, the oscillator, the resonance element, the acoustic resonant mass sensor, and the like, and the acoustic resonator may be small in size and exhibit excellent performance compared with a dielectric filter, a metal cavity filter, a wave guide, and the like so that it is widely used in communication modules of modern mobile devices that require high performance such as wide pass bandwidth or the like.

The bulk acoustic wave filter may include a plurality of bulk acoustic wave resonators, and in the bulk acoustic wave resonator, leakage of resonance energy may occur due to a lateral wave generated during resonance.

The above information is presented as background information only to assist with an understanding of the present disclosure. No determination has been made, and no assertion is made, as to whether any of the above might be applicable as prior art with regard to the disclosure.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a bulk acoustic resonator includes a resonance portion including a first electrode, a piezoelectric layer disposed on the first electrode along a height direction, and a second electrode disposed on the piezoelectric layer along the height direction. The resonance portion includes an overlapping region in which the first electrode, the piezoelectric layer, and the second electrode overlap each other along the height direction, the overlapping region includes a central portion disposed in a center of the resonance portion and an edge portion disposed outside the central portion, the edge portion includes a first edge portion and a second edge portion, a height of the second electrode of the first edge portion and a height of the second electrode of the second edge portion are lower than a height of the second electrode of the central portion along the height direction, and the height of the second electrode of the first edge portion and the height of the second electrode of the second edge portion are different from each other along the height direction.

The height of the second electrode of the central portion may be substantially constant.

The first edge portion may be disposed closer to the central portion than the second edge portion, and the height of the second electrode of the first edge portion may be greater than the height of the second electrode of the second edge portion.

A thickness of the second electrode of the central portion may be greater than each of a thickness of the second electrode of the first edge portion and a thickness of the second electrode of the second edge portion.

The thickness of the second electrode of the first edge portion may be greater than the thickness of the second electrode of the second edge portion.

A thickness of the piezoelectric layer of the central portion may be greater than a thickness of the piezoelectric layer of the edge portion.

The thickness of the piezoelectric layer of the central portion may be greater than each of a thickness of the piezoelectric layer of the first edge portion and a thickness of the piezoelectric layer of the second edge portion. The thickness of the piezoelectric layer of the first edge portion may be greater than the thickness of the piezoelectric layer of the second edge portion.

A thickness of the first electrode of the central portion may be greater than each of a thickness of the first electrode of the first edge portion and a thickness of the first electrode of the second edge portion.

The thickness of the first electrode of the first edge portion may be greater than the thickness of the first electrode of the second edge portion.

The edge portion may further include a protruding portion disposed outside the second edge portion, and a height of the second electrode of the protruding portion may be higher than a height of the second electrode of the central portion along the height direction.

The edge portion may further include an inclined portion disposed between the protruding portion and the second edge portion, and a height of the inclined portion may gradually increase from the height of the second electrode of the second edge portion to the height of the second electrode of the protruding portion along the height direction.

A thickness of the second electrode of the central portion may be greater than each of a thickness of the second electrode of the first edge portion and a thickness of the second electrode of the second edge portion, the thickness of the second electrode of the first edge portion may be greater than the thickness of the second electrode of the second edge portion, and a thickness of the second electrode of the protruding portion may be greater than the thickness of the second electrode of the central portion.

A thickness of the first electrode of the central portion may be greater than each of a thickness of the first electrode of the first edge portion and a thickness of the first electrode of the second edge portion, the thickness of the first electrode of the first edge portion may be greater than the thickness of the first electrode of the second edge portion, and a thickness of the first electrode of the protruding portion may be greater than the thickness of the first electrode of the central portion.

The bulk acoustic resonator may further include an insertion layer overlapping the protruding portion along the height direction.

An end portion of the insertion layer may include an inclined surface, and the protruding portion may include a surface inclined along the inclined surface of the insertion layer.

The insertion layer may be disposed between the piezoelectric layer and the second electrode.

The insertion layer may be disposed within the piezoelectric layer.

The insertion layer may be disposed between the first electrode and the piezoelectric layer.

The edge portion may further include a third edge portion disposed between the second edge portion and the protruding portion, and a height of the second electrode of the third edge portion may be lower than the height of the second electrode of the second edge portion along the height direction.

A thickness of the second electrode of the central portion may be greater than a thickness of the second electrode of the edge portion, a thickness of the second electrode of the first edge portion may be greater than a thickness of the second electrode of the second edge portion, and the thickness of the second electrode of the second edge portion may be greater than a thickness of the second electrode of the third edge portion.

The bulk acoustic resonator may further include an insertion layer overlapping the protruding portion along the height direction. A thickness of the second electrode of the protruding portion may be substantially the same as a thickness of the second electrode of the central portion.

The first edge portion may be disposed closer to the central portion than the second edge portion, the height of the second electrode of the first edge portion may be greater than the height of the second electrode of the second edge portion, and the height of the second electrode of the first edge portion may gradually decrease from the height of the second electrode of the central portion to the height of the second electrode of the second edge portion.

The bulk acoustic resonator may further include a cavity disposed between a substrate and the resonance portion, and the cavity may overlap the central portion of the resonance portion.

In another general aspect, a bulk acoustic resonator includes a resonance portion including a first electrode, a piezoelectric layer disposed on the first electrode along a height direction, and a second electrode disposed on the piezoelectric layer along the height direction, and an insertion layer that at least partially overlaps the resonance portion. The resonance portion includes an overlapping region in which the first electrode, the piezoelectric layer, and the second electrode overlap each other along the height direction, the overlapping region includes a central portion disposed in a center of the resonance portion and an edge portion disposed outside the central portion, the edge portion includes a first edge portion, a second edge portion, and a protruding portion, a height of the second electrode of the first edge portion and a height of the second electrode of the second edge portion are lower than a height of the second electrode of the central portion along the height direction, a height of the second electrode of the protruding portion is higher than the height of the second electrode of the central portion along the height direction, the height of the second electrode of the first edge portion and the height of the second electrode of the second edge portion are different from each other along the height direction, and the insertion layer overlaps the protruding portion along the height direction.

An end of the insertion layer may include an inclined surface, the protruding portion may include a surface inclined along the inclined surface of the insertion layer, and a height of the second electrode of the surface inclined along the inclined surface of the insertion layer may increase along the height direction as the second electrode extends away from the central portion.

In another general aspect, a bulk acoustic resonator includes an overlapping region in which a first electrode, a piezoelectric layer, and a second electrode overlap each other along a height direction, wherein the overlapping region includes a central portion and an edge portion disposed outside the central portion, the edge portion includes a first edge portion and a second edge portion disposed outside the first edge portion, a height of the second electrode of the first edge portion is lower than a height of the second electrode of the central portion along the height direction, and the height of the second electrode of the second edge portion is lower than the height of the second electrode of the first edge portion along the height direction.

A height difference among the second electrode of the central portion, the second electrode of the first edge portion, and the second electrode of the second edge portion may be due to thickness differences of one or more of the second electrode, the piezoelectric layer, and the first electrode among the central portion, the first edge portion, and the second edge portion.

The bulk acoustic resonator may further include a protruding portion disposed outside the second edge portion, wherein a height of the second electrode of the protruding portion may be higher than the height of the second electrode of the central portion along the height direction.

The bulk acoustic resonator may further include an insertion layer disposed between the first electrode and the second electrode in the overlapping region, wherein the insertion layer may overlap the protruding portion along the height direction.

An end of the insertion layer may include an inclined surface, the protruding portion may include a surface inclined along the inclined surface of the insertion layer, and a height of the second electrode of the surface inclined along the inclined surface of the insertion layer may increase along the height direction as the second electrode extends away from the central portion.

The overlapping region may constitute a resonance portion, and one or more of the edge portion and the protruding portion may be configured to prevent resonance energy generated in the central portion from being leaked to the outside.

Other features and aspects will be apparent from the following detailed description, the drawings, and the claims.

Figure 1:
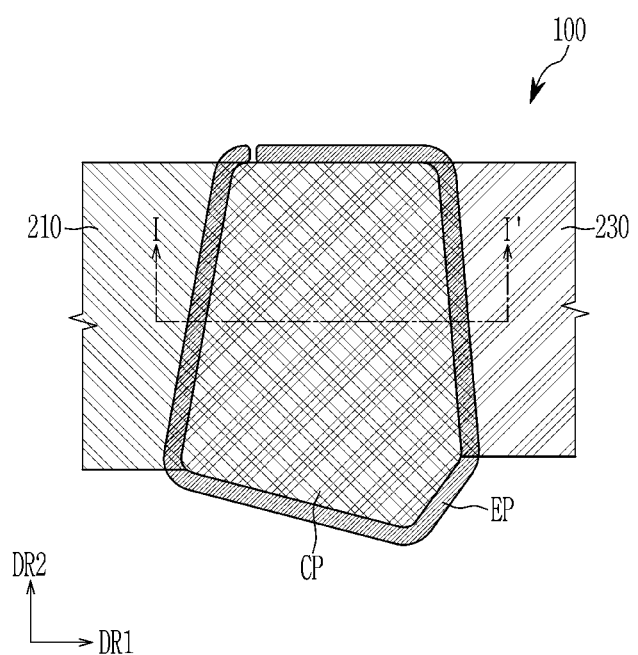
FIG. 1 is a plane view showing a portion of a bulk acoustic resonator according to an embodiment.

Throughout the drawings and the detailed description, unless otherwise described, the same reference numerals refer to the same elements. The drawings may not be to scale, and the relative size, proportions, and depiction of elements in the drawings may be exaggerated for clarity, illustration, and convenience.

DETAILED DESCRIPTION

Hereinafter, while examples of the present disclosure will be described in detail with reference to the accompanying drawings, it is noted that examples are not limited to the same.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of this disclosure. For example, the sequences of operations described herein are merely examples, and are not limited to those set forth herein, but may be changed as will be apparent after an understanding of this disclosure, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of this disclosure.

Throughout the specification, when an element, such as a layer, region, or substrate is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items; likewise, "at least one of" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Further, throughout the specification, the phrase "in a plan view" or "on a plane" means viewing a target portion from the top, and the phrase "in a cross-sectional view" or "on a cross-section" means viewing a cross-section formed by vertically cutting a target portion from the side.

Spatially relative terms, such as "above," "upper," "below," "lower," and the like, may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above," or "upper" relative to another element would then be "below," or "lower" relative to the other element. Thus, the term "above" encompasses both the above and below orientations depending on the spatial orientation of the device. The device may also be oriented in other ways (rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

Herein, it is noted that use of the term "may" with respect to an example, for example, as to what an example may include or implement, means that at least one example exists in which such a feature is included or implemented while all examples are not limited thereto.

The features of the examples described herein may be combined in various ways as will be apparent after an understanding of this disclosure. Further, although the examples described herein have a variety of configurations, other configurations are possible as will be apparent after an understanding of this disclosure.

Embodiments of this disclosure provide a bulk acoustic resonator capable of preventing leakage of resonance energy due to a lateral wave.

However, problems to be solved by the embodiments of this disclosure are not limited to the above-described problem and may be variously extended in a range of technical ideas included in the embodiments.

Figure 2:
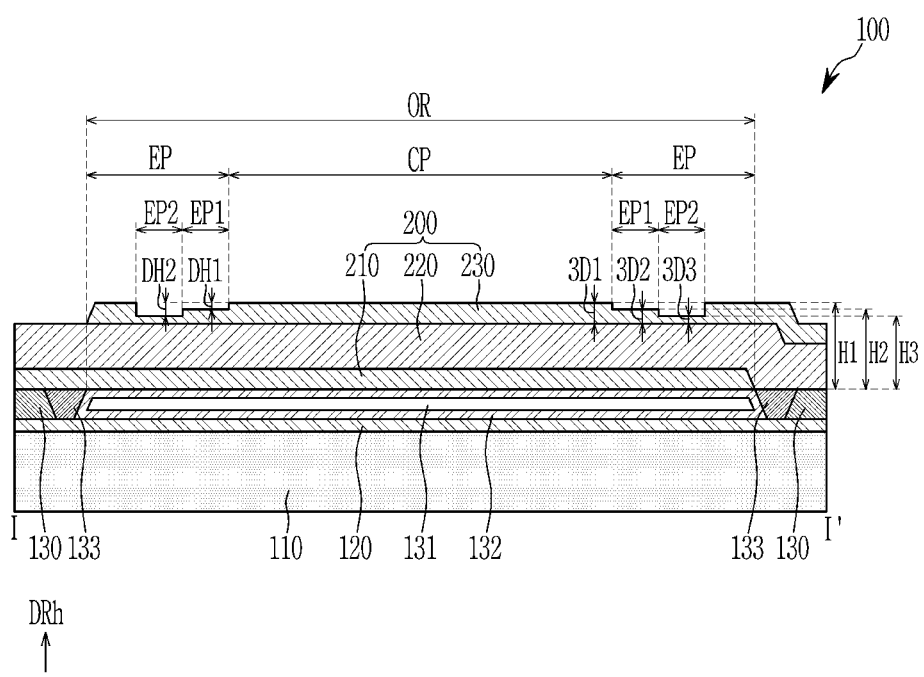
FIG. 2 is a cross-sectional view of the bulk acoustic resonator of FIG. 1.

Referring to FIGS. 1 and 2, a bulk acoustic resonator 100 according to an embodiment will be described. FIG. 1 is a plane view showing a portion of the bulk acoustic resonator according to the embodiment, and FIG. 2 is a cross-sectional view of the bulk acoustic resonator of FIG. 1. FIG. 2 may be a cross-sectional view taken along a line I-I' of FIG. 1.

Referring to FIG. 1, the bulk acoustic resonator 100 may include a region in which a first electrode 210 and a second electrode 230 partially overlap each other on a plane formed by a first direction DR1 and a second direction DR2 extending in different directions. The region in which the first electrode 210 and the second electrode 230 overlap each other may include a central portion CP and an edge portion EP disposed outside the central portion CP along an edge of the central portion CP. This will be described in more detail later.

Referring to FIG. 2, the bulk acoustic resonator 100 according to the embodiment may include a substrate (or a board) 110, a resonance portion 200 disposed above the substrate 110 along a height direction DRh perpendicular to the plane formed by the first direction DR1 and the second direction DR2, an insulating layer 120 and a cavity 131, and a support layer 130 and an etching prevention portion 133 surrounding the cavity 131 disposed between the substrate 110 and the resonance portion 200.

The substrate 110 may include silicon. For example, the substrate 110 may be a silicon substrate or a silicon on insulator (SOI) type substrate, but the present disclosure is not limited thereto.

The substrate 110 and the resonance portion 200 may be electrically insulated through the insulating layer 120 disposed on the substrate 110. In addition, when the cavity 131 is formed, the insulating layer 120 may prevent the substrate 110 from being etched by an etching gas.

The insulating layer 120 may include any one or more of silicon dioxide ($SiO_2$), silicon nitride ($Si_3N_4$), aluminum oxide ($Al_2O_3$), and aluminum nitride (AlN), but the present disclosure is not limited thereto.

The support layer 130 may be disposed on the insulating layer 120. The support layer 130 may be disposed around the cavity 131 and the etching prevention portion 133, and the support layer 130 may be disposed to surround the cavity 131 and the etching prevention portion 133.

The support layer 130 may include a polysilicon, a polymer, or the like that may be etched by an etching gas, but the present disclosure is not limited thereto.

The cavity 131 may be an empty space (e.g., an air gap), the cavity 131 may be formed by removing a portion of a sacrificial layer formed when the support layer 130 is formed, and the support layer 130 may be formed of a remaining portion of the sacrificial layer.

The etching prevention portion 133 may be disposed along a boundary of the cavity 131. The etching prevention portion 133 may prevent etching from progressing beyond a region in which the cavity is formed during formation of the cavity 131.

When the cavity 131 is formed, a halide-based etching gas such as fluorine (F), chlorine (Cl), or the like may be used to remove a portion of the support layer 130. The etching prevention portion 133 may include a material that is more difficult to be etched by the halide-based etching gas than the support layer 130. For example, the etching prevention portion 133 may include one or more of silicon dioxide ($SiO_2$) and silicon nitride ($Si_3N_4$), but the present disclosure is not limited thereto.

A hydrophobic layer 132 may be disposed at an inner wall of the cavity 131. The hydrophobic layer 132 may reduce frequency fluctuation by suppressing adsorption of water, a hydroxy (OH) group, or the like.

The resonance portion 200 may include the first electrode 210, a piezoelectric layer 220, and a second electrode 230 sequentially disposed along the height direction DRh to overlap each other.

The first electrode 210 of the resonance portion 200 may be disposed above the substrate 110 along the height direction DRh perpendicular to a surface of the substrate 110, the piezoelectric layer 220 may be disposed on the first electrode 210 along the height direction DRh, and the second electrode 230 may be disposed on the piezoelectric layer 220 along the height direction DRh.

The piezoelectric layer 220 of the resonance portion 200 may be disposed between the first electrode 210 and the second electrode 230.

The resonance portion 200 may be spaced apart from a support substrate 110 through the cavity 131, and the resonance portion 200 may vibrate in a predetermined direction by being disposed to overlap the cavity 131.

The resonance portion 200 may resonate the piezoelectric layer 220 according to signals applied to the first electrode 210 and the second electrode 230 to generate a resonance frequency and an anti-resonance frequency.

The first electrode 210 and the second electrode 230 may include a conductor. For example, the first electrode 210 and the second electrode 230 may include any one or more of gold, molybdenum, ruthenium, iridium, aluminum, platinum, titanium, tungsten, palladium, tantalum, chromium, and nickel, but the present disclosure is not limited thereto.

The first electrode 210 and the second electrode 230 may be an input electrode and an output electrode for inputting and outputting an electrical signal such as a radio frequency (RF) signal or the like.

When the first electrode 210 is the input electrode, the second electrode 230 may be the output electrode, and when the first electrode 210 is the output electrode, the second electrode 230 may be the input electrode.

The piezoelectric layer 220 may be a portion that generates a piezoelectric effect that converts electrical energy to mechanical energy in a form of an elastic wave.

The piezoelectric layer 220 may include one or more of zinc oxide (ZnO), aluminum nitride (AlN), doped aluminum nitride, lead zirconate titanate, and quartz. In a case of doped aluminum nitride, a rare earth metal, a transition metal, or an alkaline earth metal may be further included. The rare earth metal may include one or more of scandium (Sc), erbium (Er), yttrium (Y), and lanthanum (La). The transition metal may include one or more of hafnium (Hf), titanium (Ti), zirconium (Zr), tantalum (Ta), and niobium (Nb). The alkaline earth metal may include magnesium (Mg). A content of elements doped into aluminum nitride (AlN) may range from 0.1 to 30 at %.

The piezoelectric layer 220 may include a material in which aluminum nitride (AlN) is doped with scandium (Sc), and since the piezoelectric layer 220 includes the doped material, a piezoelectric constant may be increased so that an electromechanical coupling factor ($kt^2$) of an acoustic resonator is increased.

The resonance portion 200 may include an overlapping region OR in which the first electrode 210, the piezoelectric layer 220, and the second electrode 230 overlap along the height direction DRh, and resonance of the resonance portion 200 may mainly occur in the overlapping region OR.

The overlapping region OR may include the central portion CP where a surface of the second electrode 230 is substantially flat and the edge portion EP disposed at an outer edge of the central portion CP.

The central portion CP may be a region disposed at a center of the resonance portion 200, and the edge portion EP may be a region disposed along a circumference (periphery) of the central portion CP. Therefore, the edge portion EP may be a region extending outward from the central portion CP, and may be disposed in a continuous ring shape along the circumference of the central portion CP. However, the present disclosure is not limited thereto.

A height H2 or H3 of the second electrode 230 of the edge portion EP measured from a lower surface of the resonance portion 200 substantially coincident with upper surfaces of the support layer 130 and the cavity 131 along the height direction DRh may be lower than a first height H1 of the second electrode 230 of the central portion CP of the resonance portion 200 measured from the lower surface of the resonance portion 200 substantially coincident with upper surfaces of the support layer 130 and the cavity 131 along the height direction DRh.

The edge portion EP may include a first edge portion EP1 and a second edge portion EP2 having different heights of the second electrode 230 measured from the lower surface of the resonance portion 200 along the height direction DRh.

The second height H2 of the second electrode 230 of the first edge portion EP1 and the third height H3 of the second electrode 230 of the second edge portion EP2 measured from the lower surface of the resonance portion 200 along the height direction DRh may be lower than the first height H1 of the second electrode 230 of the central portion CP of the resonance portion 200 measured from the lower surface of the resonance portion 200 along the height direction DRh. The third height H3 of the second electrode 230 of the second edge portion EP2 may be lower than the second height H2 of the second electrode 230 of the first edge portion EP1.

A second height difference DH2 between the first height H1 that is a height of an upper surface of the second electrode 230 of the central portion CP and the third height H3 that is a height of an upper surface of the second electrode 230 of the second edge portion EP2, may be greater than a first height difference DH1 between the first height H1 that is the height of the upper surface of the second electrode 230 of the central portion CP and the second height H2 that is a height of an upper surface of the second electrode 230 of the first edge portion EP1. That is, the height of the upper surface of the second electrode 230 of the first edge portion EP1 may be lower than the height of the upper surface of the second electrode 230 of the central portion CP, the height of the upper surface of the second electrode 230 of the second edge portion EP2 may be lower than the height of the upper surface of the second electrode 230 of the central portion CP, and the height of the upper surface of the second electrode 230 of the second edge portion EP2 may be lower than the height of the upper surface of the second electrode 230 of the first edge portion EP1.

Hereinafter, a height difference means a height difference between a height of a surface of the second electrode 230 of the central portion CP and a height of a surface of the second electrode 230 disposed at each portion of the second electrode 230.

A thickness 3D1 of the second electrode 230 disposed at the central portion CP of the overlapping region OR of the bulk acoustic resonator 100 according to the present embodiment may be greater than a thickness 3D2 or 3D3 of the second electrode 230 disposed at the edge portion EP, and the thickness 3D2 of the second electrode 230 disposed at the first edge portion EP1 may be greater than the thickness 3D3 of the second electrode 230 disposed at the second edge portion EP2. A difference between the first height H1 of the central portion CP, the second height H2 of the first edge portion EP1, and the third height H3 of the second edge portion EP2 of the bulk acoustic resonator 100 according to the present embodiment may be adjusted by a difference in thickness according to a position of the second electrode 230.

The bulk acoustic resonator 100 according to the present embodiment may include the edge portion EP in which a height of the second electrode 230 is lower than a height of the second electrode 230 disposed at the central portion CP so as to surround the central portion CP of the resonance portion 200 so that a local density of the resonance portion 200 changes. Thus, a lateral wave may be reflected toward the central portion CP of the resonance portion 200 so that a vibration wave generated in the central portion CP of the resonance portion 200 is returned to the central portion CP without being diffused to the outside of the edge portion EP of the resonance portion 200. Therefore, it is possible to prevent resonance energy generated in the central portion CP of the resonance portion 200 from being lost (or leaked) to the outside.

On the other hand, in general, an acoustic displacement in the edge portion EP may change according to a height and a width of the edge portion EP, and the acoustic displacement of the edge portion EP may affect an acoustic displacement of the central portion CP. The central portion CP of the resonance portion 200 has to maintain a piston mode state in which spurious noise is suppressed so that a sound wave on a surface of the central portion CP is substantially absent. When the acoustic displacement is also generated in the central portion CP due to the acoustic displacement of the edge portion EP, a resonance characteristic of the central portion CP may be changed. This may result in deterioration of performance of the resonator.

For example, the spurious noise of the central portion CP may increase due to a change in a depth of the edge portion EP and a change in a width of the edge portion EP or a notch in which the resonance energy greatly changes may occur in some frequency ranges. Thus, when the depth or the width of the edge portion EP changes according to a process error of the edge portion EP, a change in the resonance characteristic of the central portion CP of the resonance portion 200 may occur, and deterioration of performance of the resonator may be induced.

According to the bulk acoustic resonator 100 of the present embodiment, the edge portion EP may include the first edge portion EP1 and the second edge portion EP2 having different heights from the central portion CP, and a size of the acoustic displacement of the edge portion EP may be determined by a combination of an acoustic displacement of the first edge portion EP1 and an acoustic displacement of the second edge portion EP2. Therefore, even if a depth and a width of any one of the first edge portion EP1 and the second edge portion EP2 of the edge portion EP change, an influence of a change in the depth or the width of the edge portion may be relatively small compared with a case where the edge portion EP is made of one region.

Therefore, according to the bulk acoustic resonator 100 of the present embodiment, it is possible to reduce an influence of the acoustic displacement due to the process error of the edge portion EP, the change in the resonance characteristic of the central portion CP of the resonance portion 200 may be reduced, and deterioration of performance of the resonator may be reduced.

Figure 3:
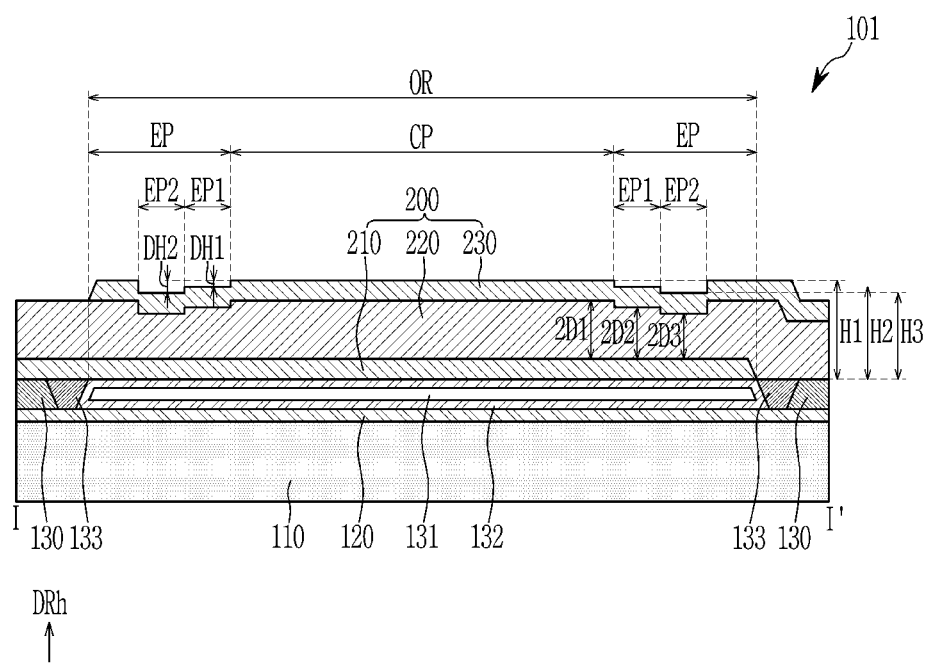
FIG. 3 is a cross-sectional view of a bulk acoustic resonator according to another embodiment.

Referring to FIG. 3, a bulk acoustic resonator 101 according to another embodiment will be described. FIG. 3 is a cross-sectional view of the bulk acoustic resonator according to the other embodiment.

Referring to FIG. 3, the bulk acoustic resonator 101 according to the present embodiment is similar to the bulk acoustic resonator 100 according to the above-described embodiment. A detailed description of the same constituent elements is omitted.

As shown in FIG. 3, the bulk acoustic resonator 101 according to the present embodiment may include the substrate 110, the resonance portion 200 disposed above the substrate 110, the insulating layer 120 and the cavity 131 disposed between the substrate 110 and the resonance portion 200, and the support layer 130 and the etching prevention portion 133 surrounding the cavity 131.

The resonance portion 200 may include the first electrode 210, the piezoelectric layer 220, and the second electrode 230 sequentially disposed along the height direction DRh to overlap each other. The piezoelectric layer 220 of the resonance portion 200 may be disposed between the first electrode 210 and the second electrode 230.

The resonance portion 200 may resonate the piezoelectric layer 220 according to signals applied to the first electrode 210 and the second electrode 230 to generate a resonance frequency and an anti-resonance frequency.

The resonance portion 200 may include the overlapping region OR in which the first electrode 210, the piezoelectric layer 220, and the second electrode 230 overlap along the height direction DRh, and resonance of the resonance portion 200 may mainly occur in the overlapping region OR.

The overlapping region OR may include the central portion CP where a surface of the second electrode 230 is approximately flat and the edge portion EP disposed at an outer edge of the central portion CP.

The central portion CP may be a region disposed at a center of the resonance portion 200, and the edge portion EP may be a region disposed along a circumference of the central portion CP.

The height H2 or H3 of the second electrode 230 of the edge portion EP measured from a lower surface of the resonance portion 200 along the height direction DRh may be lower than the first height H1 of the second electrode 230 of the central portion CP of the resonance portion 200 measured from the lower surface of the resonance portion 200 along the height direction DRh.

The edge portion EP may include the first edge portion EP1 and the second edge portion EP2 having different heights of the second electrode 230 measured from the lower surface of the resonance portion 200 along the height direction DRh.

The second height H2 of the second electrode 230 of the first edge portion EP1 and the third height H3 of the second electrode 230 of the second edge portion EP2 measured from the lower surface of the resonance portion 200 along the height direction DRh may be lower than the first height H1 of the second electrode 230 of the central portion CP of the resonance portion 200 measured from the lower surface of the resonance portion 200 along the height direction DRh. The third height H3 of the second electrode 230 of the second edge portion EP2 may be lower than the second height H2 of the second electrode 230 of the first edge portion EP1.

The second height difference DH2 between the first height H1 of the central portion CP and the third height H3 of the second edge portion EP2 may be greater than the first height difference DH1 between the first height H1 of the central portion CP and the second height H2 of the first edge portion EP1. That is, the height of the upper surface of the second electrode 230 of the first edge portion EP1 may be lower than the height of the upper surface of the second electrode 230 of the central portion CP, the height of the upper surface of the second electrode 230 of the second edge portion EP2 may be lower than the height of the upper surface of the second electrode 230 of the central portion CP, and the height of the upper surface of the second electrode 230 of the second edge portion EP2 may be lower than the height of the upper surface of the second electrode 230 of the first edge portion EP1.

Unlike the bulk acoustic resonator 100 according to the embodiment described above, a thickness 2D1 of the piezoelectric layer 220 disposed at the central portion CP of the overlapping region OR of the bulk acoustic resonator 101 according to the present embodiment may be greater than a thickness 2D2 or 2D3 of the piezoelectric layer 220 disposed at the edge portion EP, and the thickness 2D2 of the piezoelectric layer 220 disposed at the first edge portion EP1 may be greater than the thickness 2D3 of the piezoelectric layer 220 disposed at the second edge portion EP2. A difference between the first height H1 of the central portion CP, the second height H2 of the first edge portion EP1, and the third height H3 of the second edge portion EP2 of the bulk acoustic resonator 101 according to the present embodiment may be adjusted by a difference in thickness according to a position of the piezoelectric layer 220.

The bulk acoustic resonator 101 according to the present embodiment may include the edge portion EP in which a height of the second electrode 230 is lower than a height of the second electrode 230 disposed at the central portion CP so as to surround the central portion CP of the resonance portion 200 so that a local density of the resonance portion 200 changes. Thus, a lateral wave may be reflected toward the central portion CP of the resonance portion 200, and a lateral wave generated in the central portion CP of the resonance portion 200 may be returned to the central portion CP without being diffused to the outside of the edge portion EP of the resonance portion 200. Therefore, it is possible to prevent resonance energy generated in the central portion CP of the resonance portion 200 from being lost (or leaked) to the outside.

According to the bulk acoustic resonator 101 of the present embodiment, the edge portion EP may include the first edge portion EP1 and the second edge portion EP2 having different heights from the central portion CP, and a size of the acoustic displacement of the edge portion EP may be determined by a combination of the acoustic displacement of the first edge portion EP1 and the acoustic displacement of the second edge portion EP2. Therefore, even if a depth and a width of any one of the first edge portion EP1 and the second edge portion EP2 of the edge portion EP change, an influence of a change in the depth or the width of the edge portion may be relatively small compared with a case where the edge portion EP is made of one region.

Therefore, according to the bulk acoustic resonator 101 of the present embodiment, an influence of the acoustic displacement due to the process error of the edge portion EP may be reduced, the change in the resonance characteristic of the central portion CP of the resonance portion 200 may be reduced, and deterioration of performance of the resonator may be reduced.

Figure 4:
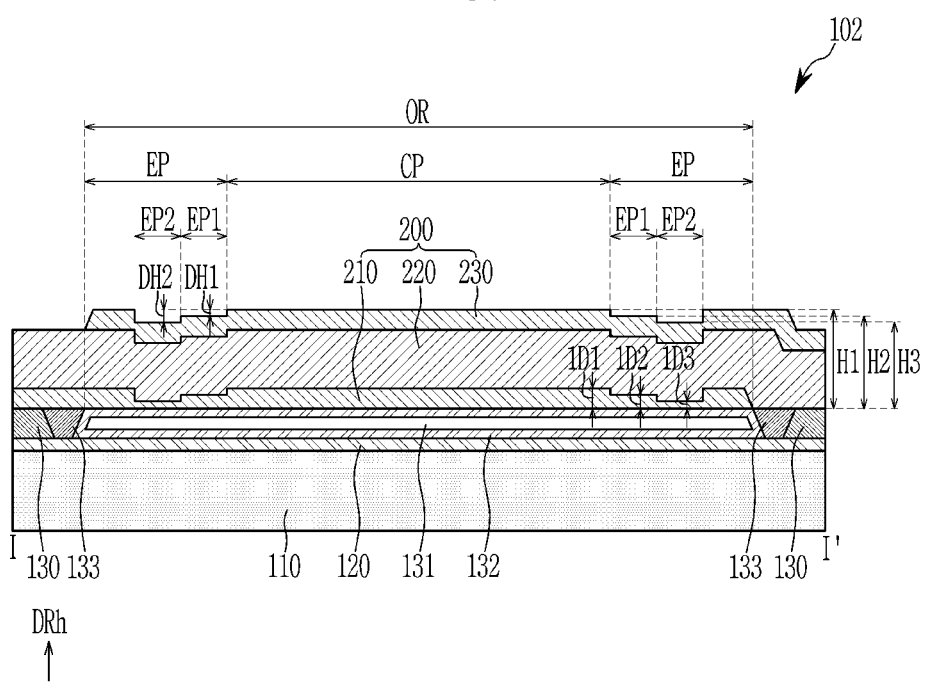
FIG. 4 is a cross-sectional view of a bulk acoustic resonator according to another embodiment.

Referring to FIG. 4, a bulk acoustic resonator 102 according to another embodiment will be described. FIG. 4 is a cross-sectional view of the bulk acoustic resonator according to the other embodiment.

Referring to FIG. 4, the bulk acoustic resonator 102 according to the present embodiment is similar to the bulk acoustic resonators 100 and 101 according to the above-described embodiments. A detailed description of the same constituent elements is omitted.

As shown in FIG. 4, the bulk acoustic resonator 102 according to the present embodiment may include the substrate 110, the resonance portion 200 disposed above the substrate 110, the insulating layer 120 and the cavity 131 disposed between the substrate 110 and the resonance portion 200, and the support layer 130 and the etching prevention portion 133 surrounding the cavity 131.

The resonance portion 200 may include the first electrode 210, the piezoelectric layer 220, and the second electrode 230 sequentially disposed along the height direction DRh to overlap each other. The piezoelectric layer 220 of the resonance portion 200 may be disposed between the first electrode 210 and the second electrode 230.

The resonance portion 200 may resonate the piezoelectric layer 220 according to signals applied to the first electrode 210 and the second electrode 230 to generate a resonance frequency and an anti-resonance frequency.

The resonance portion 200 may include the overlapping region OR in which the first electrode 210, the piezoelectric layer 220, and the second electrode 230 overlap along the height direction DRh, and resonance of the resonance portion 200 may mainly occur in the overlapping region OR.

The overlapping region OR may include the central portion CP where a surface of the second electrode 230 is approximately flat and the edge portion EP disposed at an edge of the central portion CP.

The central portion CP may be a region disposed at a center of the resonance portion 200, and the edge portion EP may be a region disposed along a circumference of the central portion CP.

The height H2 or H3 of the second electrode 230 of the edge portion EP measured from a lower surface of the resonance portion 200 along the height direction DRh may be lower than the first height H1 of the second electrode 230 of the central portion CP of the resonance portion 200 measured from the lower surface of the resonance portion 200 along the height direction DRh.

The edge portion EP may include the first edge portion EP1 and the second edge portion EP2 having different heights of the second electrode 230 measured from the lower surface of the resonance portion 200 along the height direction DRh.

The second height H2 of the second electrode 230 of the first edge portion EP1 and the third height H3 of the second electrode 230 of the second edge portion EP2 measured from the lower surface of the resonance portion 200 along the height direction DRh may be lower than the first height H1 of the second electrode 230 of the central portion CP of the resonance portion 200 measured from the lower surface of the resonance portion 200 along the height direction DRh. The third height H3 of the second electrode 230 of the second edge portion EP2 may be lower than the second height H2 of the second electrode 230 of the first edge portion EP1.

The second height difference DH2 between the first height H1 of the central portion CP and the third height H3 of the second edge portion EP2 may be greater than the first height difference DH1 between the first height H1 of the central portion CP and the second height H2 of the first edge portion EP1. That is, the height of the upper surface of the second electrode 230 of the first edge portion EP1 may be lower than the height of the upper surface of the second electrode 230 of the central portion CP, the height of the upper surface of the second electrode 230 of the second edge portion EP2 may be lower than the height of the upper surface of the second electrode 230 of the central portion CP, and the height of the upper surface of the second electrode 230 of the second edge portion EP2 may be lower than the height of the upper surface of the second electrode 230 of the first edge portion EP1.

Unlike the bulk acoustic resonator 100 or 101 according to the embodiments described above, a thickness 1D1 of the first electrode 210 disposed at the central portion CP of the overlapping region OR of the bulk acoustic resonator 102 according to the present embodiment may be greater than a thickness 1D2 or 1D3 of the first electrode 210 disposed at the edge portion EP, and the thickness 1D2 of the first electrode 210 disposed at the first edge portion EP1 may be greater than the thickness 1D3 of the first electrode 210 disposed at the second edge portion EP2. A difference between the first height H1 of the central portion CP, the second height H2 of the first edge portion EP1, and the third height H3 of the second edge portion EP2 of the bulk acoustic resonator 102 according to the present embodiment may be adjusted by a difference in thickness according to a position of the first electrode 210.

The bulk acoustic resonator 102 according to the present embodiment may include the edge portion EP in which a height of the second electrode 230 is lower than a height of the second electrode 230 disposed at the central portion CP so as to surround the central portion CP of the resonance portion 200 so that a local density of the resonance portion 200 changes. Thus, a lateral wave may be reflected toward the central portion CP of the resonance portion 200, and a lateral wave generated in the central portion CP of the resonance portion 200 may be returned to the central portion CP without being diffused to the outside of the edge portion EP of the resonance portion 200. Therefore, it is possible to prevent resonance energy generated in the central portion CP of the resonance portion 200 from being lost (or leaked) to the outside.

According to the bulk acoustic resonator 102 of the present embodiment, the edge portion EP may include the first edge portion EP1 and the second edge portion EP2 having different heights from the central portion CP, and a size of the acoustic displacement of the edge portion EP may be determined by a combination of the acoustic displacement of the first edge portion EP1 and the acoustic displacement of the second edge portion EP2. Therefore, even if a depth and a width of any one of the first edge portion EP1 and the second edge portion EP2 of the edge portion EP change, an influence of a change in the depth or the width of the edge portion may be relatively small compared with a case where the edge portion EP is made of one region.

Therefore, according to the bulk acoustic resonator 102 of the present embodiment, it is possible to reduce an influence of the acoustic displacement due to the process error of the edge portion EP, the change in the resonance characteristic of the central portion CP of the resonance portion 200 may be reduced, and deterioration of performance of the resonator may be reduced.

Figure 5:
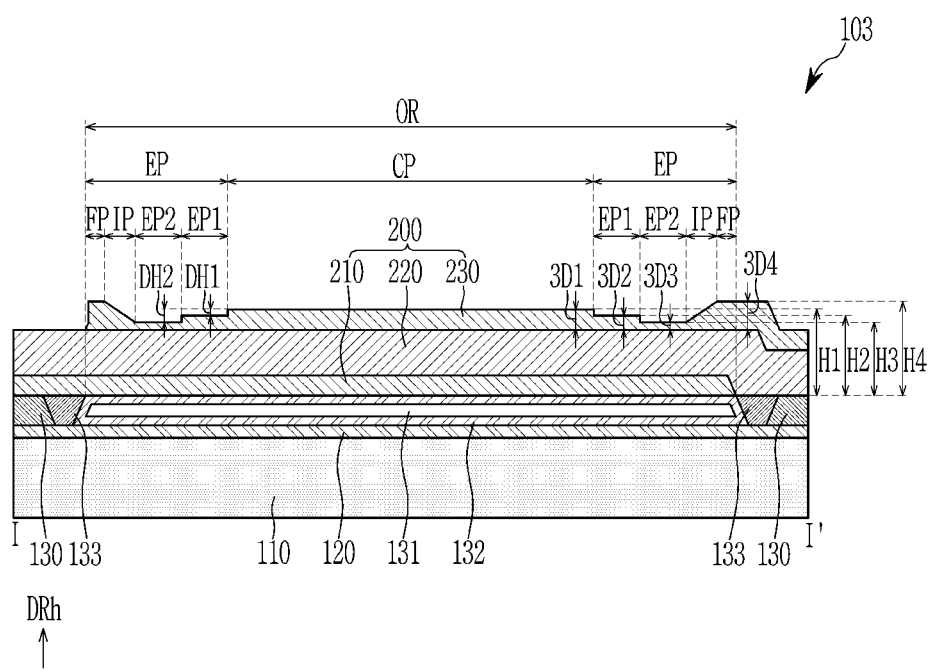
FIG. 5 is a cross-sectional view of a bulk acoustic resonator according to another embodiment.

Referring to FIG. 5, a bulk acoustic resonator 103 according to another embodiment will be described. FIG. 5 is a cross-sectional view of the bulk acoustic resonator according to the other embodiment.

Referring to FIG. 5, the bulk acoustic resonator 103 according to the present embodiment is similar to the bulk acoustic resonators 100, 101, and 102 according to the above-described embodiments. A detailed description of the same constituent elements is omitted.

As shown in FIG. 5, the bulk acoustic resonator 103 according to the present embodiment may include the substrate 110, the resonance portion 200 disposed above the substrate 110, the insulating layer 120 and the cavity 131 disposed between the substrate 110 and the resonance portion 200, and the support layer 130 and the etching prevention portion 133 surrounding the cavity 131.

The resonance portion 200 may include the first electrode 210, the piezoelectric layer 220, and the second electrode 230 sequentially disposed along the height direction DRh to overlap each other. The piezoelectric layer 220 of the resonance portion 200 may be disposed between the first electrode 210 and the second electrode 230.

The resonance portion 200 may resonate the piezoelectric layer 220 according to signals applied to the first electrode 210 and the second electrode 230 to generate a resonance frequency and an anti-resonance frequency.

The resonance portion 200 may include the overlapping region OR in which the first electrode 210, the piezoelectric layer 220, and the second electrode 230 overlap along the height direction DRh, and resonance of the resonance portion 200 may mainly occur in the overlapping region OR.

The overlapping region OR may include the central portion CP where a surface of the second electrode 230 is approximately flat and the edge portion EP disposed at an edge of the central portion CP.

The central portion CP may be a region disposed at a center of the resonance portion 200, and the edge portion EP may be a region disposed along a circumference of the central portion CP.

The edge portion EP may include the first edge portion EP1 and the second edge portion EP2 having different heights of the second electrode 230 measured from the lower surface of the resonance portion 200 along the height direction DRh.

Unlike the bulk acoustic resonator 100, 101, or 102 according to the embodiments described above, the edge portion EP of the overlapping region OR of the bulk acoustic resonator 103 according to the present embodiment may further include a protruding portion FP having a fourth height H4 that is measured from the lower surface of the resonance portion 200 along the height direction DRh and is higher than the first height H1 of the central portion CP.

The protruding portion FP of the edge portion EP may be disposed further outside the central portion CP than the first edge portion EP1 and the second edge portion EP2.

In addition, the edge portion EP of the overlapping region OR of the bulk acoustic resonator 103 according to the present embodiment may further include an inclined portion IP disposed between the second edge portion EP2 and the protruding portion FP. The inclined portion IP may be a portion having an inclined surface in which a height gradually increases from the second edge portion EP2 to the protruding portion FP. The inclined portion IP may be omitted.

The height H2 or H3 of the second electrode 230 of the edge portion EP measured from a lower surface of the resonance portion 200 along the height direction DRh may be lower than the first height H1 of the second electrode 230 of the central portion CP of the resonance portion 200 measured from the lower surface of the resonance portion 200 along the height direction DRh.

The second height H2 of the second electrode 230 of the first edge portion EP1 and the third height H3 of the second electrode 230 of the second edge portion EP2 measured from the lower surface of the resonance portion 200 along the height direction DRh may be lower than the first height H1 of the second electrode 230 of the central portion CP of the resonance portion 200 measured from the lower surface of the resonance portion 200 along the height direction DRh. The third height H3 of the second electrode 230 of the second edge portion EP2 may be lower than the second height H2 of the second electrode 230 of the first edge portion EP1.

The second height difference DH2 between the first height H1 of the central portion CP and the third height H3 of the second edge portion EP2 may be greater than the first height difference DH1 between the first height H1 of the central portion CP and the second height H2 of the first edge portion EP1. That is, the height of the upper surface of the second electrode 230 of the first edge portion EP1 may be lower than the height of the upper surface of the second electrode 230 of the central portion CP, the height of the upper surface of the second electrode 230 of the second edge portion EP2 may be lower than the height of the upper surface of the second electrode 230 of the central portion CP, and the height of the upper surface of the second electrode 230 of the second edge portion EP2 may be lower than the height of the upper surface of the second electrode 230 of the first edge portion EP1.

The fourth height H4 of the protruding portion FP measured from the lower surface of the resonance portion 200 along the height direction DRh may be higher than the first height H1 of the central portion CP.

Similar to the bulk acoustic resonator 100 according to the embodiment described above with reference to FIG. 1, the thickness 3D1 of the second electrode 230 disposed at the central portion CP of the overlapping region OR of the bulk acoustic resonator 103 according to the present embodiment may be greater than the thickness 3D2 or 3D3 of the second electrode 230 disposed at the edge portion EP, and the thickness 3D2 of the second electrode 230 disposed at the first edge portion EP1 may be greater than the thickness 3D3 of the second electrode 230 disposed at the second edge portion EP2.

A thickness 3D4 of the second electrode 230 disposed at the protruding portion FP of the bulk acoustic resonator 103 according to the present embodiment may be greater than the thickness 3D1 of the second electrode 230 disposed at the central portion CP, and a thickness of the second electrode 230 disposed at the inclined portion IP may gradually increase from the edge portion EP to the protruding portion FP.

A difference between the first height H1 of the central portion CP, the second height H2 of the first edge portion EP1, the third height H3 of the second edge portion EP2, and the fourth height H4 of the protruding portion FP of the bulk acoustic resonator 103 according to the present embodiment may be adjusted by a difference in thickness according to a position of the second electrode 230.

According to the bulk acoustic resonator 103 of the present embodiment, the edge portion EP disposed to surround the central portion CP of the overlapping region OR may include the first edge portion EP1 and the second edge portion EP2 having a lower height of the second electrode 230 than a height of the second electrode 230 disposed at the central portion CP so that a local density of the resonance portion 200 changes. Thus, a lateral wave may be reflected toward the central portion CP of the resonance portion 200, and a lateral wave generated in the central portion CP of the resonance portion 200 may be returned to the central portion CP without being diffused to the outside of the edge portion EP of the resonance portion 200. Therefore, it is possible to prevent resonance energy generated in the central portion CP of the resonance portion 200 from being lost (or leaked) to the outside.

In addition, according to the bulk acoustic resonator 103 of the present embodiment, the edge portion EP disposed to surround the central portion CP of the overlapping region OR may further include not only the first edge portion EP1 and the second edge portion EP2 having a lower height of the second electrode 230 than a height of the second electrode 230 disposed at the central portion CP but also the protruding portion FP disposed further outside the central portion CP than the second edge portion EP2 and having a height of the second electrode 230 higher than a height of the second electrode 230 disposed at the central portion CP.

A resonance frequency (more specifically, a cutoff frequency corresponding to kx=0 in a dispersion curve) of each region of the resonance portion 200 may be decreased in an order of the edge portion EP, the central portion CP, and the protruding portion FP of the resonance portion 200.

The central portion CP of the resonance portion 200 may maintain the piston mode state in which the spurious noise is suppressed so that the sound wave on the surface of the central portion CP is substantially absent, and the edge portion EP surrounding the central portion CP may include the first edge portion EP1 and the second edge portion EP2 having the lower height of the second electrode 230 than the height of the second electrode 230 disposed at the central portion CP and the protruding portion FP having a height of the second electrode 230 higher than the height of the second electrode 230 disposed at the central portion CP so that a local density of the resonance portion 200 changes in the edge portion EP. Thus, a lateral wave may be reflected toward the central portion CP of the resonance portion 200, and a sound wave may be attenuated in the protruding portion FP to suppress leakage of energy to the outside of the resonance portion 200.

As described above, in general, when an acoustic displacement occurs in the edge portion EP due to the change in the depth of the edge portion EP and the change in the width of the edge portion EP, an acoustic displacement may also occur in the central portion CP due to this influence. Thus, the resonance characteristic of the central portion CP may be changed so that deterioration of performance of the resonator is caused.

According to the bulk acoustic resonator 103 of the present embodiment, the edge portion EP may include the first edge portion EP1 and the second edge portion EP2 having different heights, and a size of the acoustic displacement of the edge portion EP may be determined by a combination of the acoustic displacement of the first edge portion EP1 and the acoustic displacement of the second edge portion EP2. Therefore, even if a depth and a width of any one of the first edge portion EP1 and the second edge portion EP2 of the edge portion EP change, an influence of a change in the depth or the width of the edge portion may be relatively small compared with a case where the edge portion EP is made of one region.

Therefore, according to the bulk acoustic resonator 103 of the present embodiment, it is possible to reduce an influence of the acoustic displacement due to the process error of the edge portion EP, the change in the resonance characteristic of the central portion CP of the resonance portion 200 may be reduced, and deterioration of performance of the resonator may be reduced.

Figure 6:
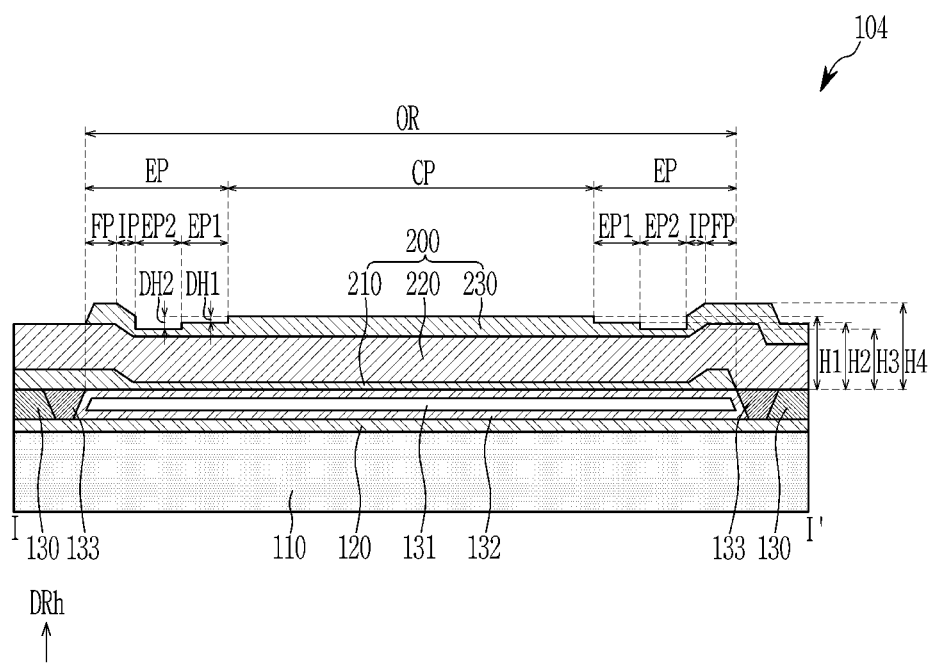
FIG. 6 is a cross-sectional view of a bulk acoustic resonator according to another embodiment.

Referring to FIG. 6, a bulk acoustic resonator 104 according to another embodiment will be described. FIG. 6 is a cross-sectional view of the bulk acoustic resonator according to the other embodiment.

Referring to FIG. 6, the bulk acoustic resonator 104 according to the present embodiment is similar to the bulk acoustic resonators 100, 101, 102, and 103 according to the above-described embodiments. A detailed description of the same constituent elements is omitted.

As shown in FIG. 6, the bulk acoustic resonator 104 according to the present embodiment may include the substrate 110, the resonance portion 200 disposed above the substrate 110, the insulating layer 120 and the cavity 131 disposed between the substrate 110 and the resonance portion 200, and the support layer 130 and the etching prevention portion 133 surrounding the cavity 131.

The resonance portion 200 may include the first electrode 210, the piezoelectric layer 220, and the second electrode 230 sequentially disposed along the height direction DRh to overlap each other. The piezoelectric layer 220 of the resonance portion 200 may be disposed between the first electrode 210 and the second electrode 230.

The resonance portion 200 may resonate the piezoelectric layer 220 according to signals applied to the first electrode 210 and the second electrode 230 to generate a resonance frequency and an anti-resonance frequency.

The resonance portion 200 may include the overlapping region OR in which the first electrode 210, the piezoelectric layer 220, and the second electrode 230 overlap along the height direction DRh, and resonance of the resonance portion 200 may mainly occur in the overlapping region OR.

The overlapping region OR may include the central portion CP where a surface of the second electrode 230 is approximately flat and the edge portion EP disposed at an edge of the central portion CP.

The central portion CP may be a region disposed at a center of the resonance portion 200, and the edge portion EP may be a region disposed along a circumference of the central portion CP.

The edge portion EP may include the first edge portion EP1, the second edge portion EP2, the protruding portion FP, and the inclined portion IP having different heights of the second electrode 230 measured from the lower surface of the resonance portion 200 along the height direction DRh.

The protruding portion FP of the edge portion EP may be disposed further outside the central portion CP than the first edge portion EP1 and the second edge portion EP2, and the inclined portion IP may be disposed between the second edge portion EP2 and the protruding portion FP.

The height H2 or H3 of the second electrode 230 of the edge portion EP measured from a lower surface of the resonance portion 200 along the height direction DRh may be lower than the first height H1 of the second electrode 230 of the central portion CP of the resonance portion 200 measured from the lower surface of the resonance portion 200 along the height direction DRh.

The second height H2 of the second electrode 230 of the first edge portion EP1 and the third height H3 of the second electrode 230 of the second edge portion EP2 measured from the lower surface of the resonance portion 200 along the height direction DRh may be lower than the first height H1 of the second electrode 230 of the central portion CP of the resonance portion 200 measured from the lower surface of the resonance portion 200 along the height direction DRh. The third height H3 of the second electrode 230 of the second edge portion EP2 may be lower than the second height H2 of the second electrode 230 of the first edge portion EP1.

The second height difference DH2 between the first height H1 of the central portion CP and the third height H3 of the second edge portion EP2 may be greater than the first height difference DH1 between the first height H1 of the central portion CP and the second height H2 of the first edge portion EP1. That is, the height of the upper surface of the second electrode 230 of the first edge portion EP1 may be lower than the height of the upper surface of the second electrode 230 of the central portion CP, the height of the upper surface of the second electrode 230 of the second edge portion EP2 may be lower than the height of the upper surface of the second electrode 230 of the central portion CP, and the height of the upper surface of the second electrode 230 of the second edge portion EP2 may be lower than the height of the upper surface of the second electrode 230 of the first edge portion EP1.

The fourth height H4 of the protruding portion FP measured from the lower surface of the resonance portion 200 along the height direction DRh may be higher than the first height H1 of the central portion CP.

The inclined portion IP may be a portion having an inclined surface in which a height gradually increases from the second edge portion EP2 to the protruding portion FP. For example, the inclined portion IP may be a portion having an inclined surface in which a height gradually increases from a height higher than the upper surface of the second electrode 230 of the second edge portion EP2 to the protruding portion FP and a wall may extend from the upper surface of the second electrode 230 of the second edge portion EP2 in the height direction DRh to the inclined portion. The inclined portion IP may be omitted.

Similar to the bulk acoustic resonators 100 and 103 according to the embodiments described above with reference to FIGS. 2 and 5, a thickness of the second electrode 230 disposed at the central portion CP of the overlapping region OR of the bulk acoustic resonator 104 according to the present embodiment may be greater than that of the second electrode 230 disposed at the edge portion EP, and a thickness of the second electrode 230 disposed at the first edge portion EP1 may be greater than a thickness of the second electrode 230 disposed at the second edge portion EP2.

However, unlike the bulk acoustic resonators 100 and 103 according to the embodiments described above with reference to FIGS. 2 and 5, a thickness of the second electrode 230 disposed at the protruding portion FP of the bulk acoustic resonator 104 according to the present embodiment may be almost the same as that of the second electrode 230 disposed at the central portion CP, but a thickness of the first electrode 210 disposed at the protruding portion FP may be greater than a thickness of the first electrode 210 disposed at the central portion CP, and a thickness of the first electrode 210 disposed at the inclined portion IP may gradually increase from the second edge portion EP2 to the protruding portion FP.

A difference between the first height H1 of the central portion CP, the second height H2 of the first edge portion EP1, the third height H3 of the second edge portion EP2, and the fourth height H4 of the protruding portion FP of the bulk acoustic resonator 104 according to the present embodiment may be adjusted by a thickness of the second electrode 230 and a thickness of the first electrode 210.

The embodiment of FIG. 6 illustrates that the first electrode 210 of the protruding portion FP protrudes toward the piezoelectric layer 220 more than the central portion CP so that a thickness of the first electrode 210 of the protruding portion FP is greater than that of the central portion CP, but unlike this, the first electrode 210 of the protruding portion FP may protrude toward the substrate 110 compared with the central portion CP.

According to the bulk acoustic resonator 104 of the present embodiment, the edge portion EP disposed to surround the central portion CP of the overlapping region OR may include the first edge portion EP1 and the second edge portion EP2 having a lower height of the second electrode 230 than a height of the second electrode 230 disposed at the central portion CP so that a local density of the resonance portion 200 changes. Thus, a lateral wave may be reflected toward the central portion CP of the resonance portion 200, and a lateral wave generated in the central portion CP of the resonance portion 200 may be returned to the central portion CP without being diffused to the outside of the edge portion EP of the resonance portion 200. Therefore, it is possible to prevent resonance energy generated in the central portion CP of the resonance portion 200 from being lost (or leaked) to the outside.

In addition, according to the bulk acoustic resonator 104 of the present embodiment, the edge portion EP disposed to surround the central portion CP of the overlapping region OR may further include not only the first edge portion EP1 and the second edge portion EP2 having a lower height of the second electrode 230 than a height of the second electrode 230 disposed at the central portion CP but also the protruding portion FP disposed further outside the central portion CP than the second edge portion EP2 and having a height of the second electrode 230 higher than a height of the second electrode 230 disposed at the central portion CP. Thus, a sound wave may be attenuated in the protruding portion FP to suppress leakage of energy to the outside of the resonance portion 200.

According to the bulk acoustic resonator 104 of the present embodiment, the edge portion EP may include the first edge portion EP1 and the second edge portion EP2 having different heights, and a size of the acoustic displacement of the edge portion EP may be determined by a combination of the acoustic displacement of the first edge portion EP1 and the acoustic displacement of the second edge portion EP2. Therefore, even if a depth and a width of any one of the first edge portion EP1 and the second edge portion EP2 of the edge portion EP change, an influence of a change in the depth or the width of the edge portion may be relatively small compared with a case where the edge portion EP is made of one region.

Therefore, according to the bulk acoustic resonator 104 of the present embodiment, it is possible to reduce an influence of the acoustic displacement due to the process error of the edge portion EP, the change in the resonance characteristic of the central portion CP of the resonance portion 200 may be reduced, and deterioration of performance of the resonator may be reduced.

Figure 7:
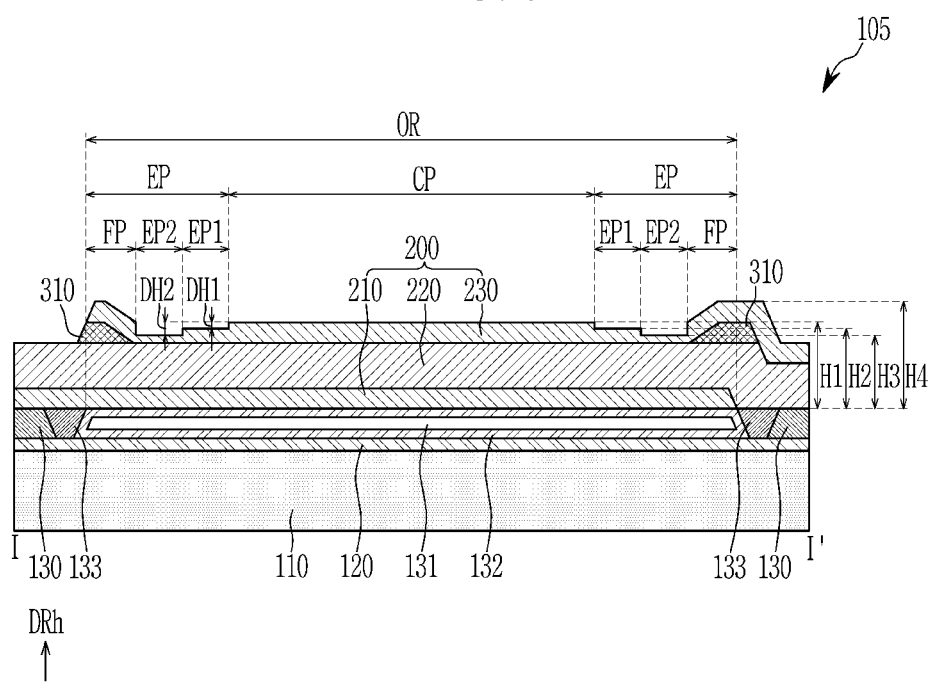
FIG. 7 is a cross-sectional view of a bulk acoustic resonator according to another embodiment.

Referring to FIG. 7, a bulk acoustic resonator 105 according to another embodiment will be described. FIG. 7 is a cross-sectional view of the bulk acoustic resonator according to the other embodiment.

Referring to FIG. 7, the bulk acoustic resonator 105 according to the present embodiment is similar to the bulk acoustic resonators 100, 101, 102, 103, and 104 according to the above-described embodiments. A detailed description of the same constituent elements is omitted.

As shown in FIG. 7, the bulk acoustic resonator 105 according to the present embodiment may include the substrate 110, the resonance portion 200 disposed above the substrate 110, the insulating layer 120 and the cavity 131 disposed between the substrate 110 and the resonance portion 200, and the support layer 130 and the etching prevention portion 133 surrounding the cavity 131.

The resonance portion 200 may include the first electrode 210, the piezoelectric layer 220, and the second electrode 230 sequentially disposed along the height direction DRh to overlap each other. The piezoelectric layer 220 of the resonance portion 200 may be disposed between the first electrode 210 and the second electrode 230.

The resonance portion 200 may resonate the piezoelectric layer 220 according to signals applied to the first electrode 210 and the second electrode 230 to generate a resonance frequency and an anti-resonance frequency.

The resonance portion 200 may include the overlapping region OR in which the first electrode 210, the piezoelectric layer 220, and the second electrode 230 overlap along the height direction DRh, and resonance of the resonance portion 200 may mainly occur in the overlapping region OR.

The overlapping region OR may include the central portion CP where a surface of the second electrode 230 is approximately flat and the edge portion EP disposed at an edge of the central portion CP.

The central portion CP may be a region disposed at a center of the resonance portion 200, and the edge portion EP may be a region disposed along a circumference of the central portion CP.

The edge portion EP may include the first edge portion EP1, the second edge portion EP2, and the protruding portion FP having different heights of the second electrode 230 measured from the lower surface of the resonance portion 200 along the height direction DRh.

The protruding portion FP of the edge portion EP may be disposed further outside the central portion CP than the first edge portion EP1 and the second edge portion EP2.

The height H2 or H3 of the second electrode 230 of the edge portion EP measured from a lower surface of the resonance portion 200 along the height direction DRh may be lower than the first height H1 of the second electrode 230 of the central portion CP of the resonance portion 200 measured from the lower surface of the resonance portion 200 along the height direction DRh.

The second height H2 of the second electrode 230 of the first edge portion EP1 and the third height H3 of the second electrode 230 of the second edge portion EP2 measured from the lower surface of the resonance portion 200 along the height direction DRh may be lower than the first height H1 of the second electrode 230 of the central portion CP of the resonance portion 200 measured from the lower surface of the resonance portion 200 along the height direction DRh. The third height H3 of the second electrode 230 of the second edge portion EP2 may be lower than the second height H2 of the second electrode 230 of the first edge portion EP1.

The second height difference DH2 between the first height H1 of the central portion CP and the third height H3 of the second edge portion EP2 may be greater than the first height difference DH1 between the first height H1 of the central portion CP and the second height H2 of the first edge portion EP1. That is, the height of the upper surface of the second electrode 230 of the first edge portion EP1 may be lower than the height of the upper surface of the second electrode 230 of the central portion CP, the height of the upper surface of the second electrode 230 of the second edge portion EP2 may be lower than the height of the upper surface of the second electrode 230 of the central portion CP, and the height of the upper surface of the second electrode 230 of the second edge portion EP2 may be lower than the height of the upper surface of the second electrode 230 of the first edge portion EP1.

The fourth height H4 of the protruding portion FP measured from the lower surface of the resonance portion 200 along the height direction DRh may be higher than the first height H1 of the central portion CP.

An insertion layer 310 may overlap the protruding portion FP of the edge portion EP.

The insertion layer 310 may be disposed between the piezoelectric layer 220 and the second electrode 230 of the resonance portion 200.

A thickness of the insertion layer 310 may increase as the insertion layer 310 extends away from the central portion CP, and a side surface adjacent to the central portion CP of the insertion layer 310 may have an inclined surface shape having a constant inclination angle. An inclination angle of an inclined surface of the insertion layer 310 may range from 5° or more to 70° or less. The protruding portion FP may have a shape in which an upper surface is raised along a shape of the insertion layer 310.

The insertion layer 310 may be disposed around the central portion CP to support the protruding portion FP.

The insertion layer 310 may be disposed at a region other than the central portion CP. For example, the insertion layer 310 may be disposed at an entire region except for the central portion CP above the substrate 110, or may be disposed at a portion of the entire region such as the edge region EP.

The insertion layer 310 may be formed of a dielectric material such as silicon oxide ($SiO_2$), aluminum nitride (AlN), aluminum oxide ($Al_2O_3$), silicon nitride ($Si_3N_4$), magnesium oxide (MgO), zirconium oxide ($ZrO_2$), lead zirconate titanate (PZT), gallium arsenic (GaAs), hafnium oxide ($HfO_2$), titanium oxide ($TiO_2$), zinc oxide (ZnO), or the like, but may include a material different from that of the piezoelectric layer 220.

In addition, the insertion layer 310 may include a metal material. When the acoustic resonator is used for 5G communication, heat generated in the resonance portion 200 needs to be smoothly dissipated (discharged) since a lot of heat is generated in the resonator. The insertion layer 310 may include an aluminum alloy including scandium (Sc) so that heat generated in the resonance portion 200 may be smoothly dissipated.

Similar to the bulk acoustic resonators 100 and 103 according to the embodiments described above with reference to FIGS. 2 and 5, a thickness of the second electrode 230 disposed at the central portion CP of the overlapping region OR of the bulk acoustic resonator 105 according to the present embodiment may be greater than that of the second electrode 230 disposed at the edge portion EP, and a thickness of the second electrode 230 disposed at the first edge portion EP1 may be greater than a thickness of the second electrode 230 disposed at the second edge portion EP2.

A thickness of the second electrode 230 disposed at the protruding portion FP of the bulk acoustic resonator 105 according to the present embodiment may be almost the same as that of the second electrode 230 disposed at the central portion CP.

A difference between the first height H1 of the central portion CP, the second height H2 of the first edge portion EP1, and the third height H3 of the second edge portion EP2 of the bulk acoustic resonator 105 according to the present embodiment may be adjusted by a thickness of the second electrode 230, and the fourth height H4 of the protruding portion FP may be adjusted by a thickness of the insertion layer 310.

According to the bulk acoustic resonator 105 of the present embodiment, the edge portion EP disposed to surround the central portion CP of the overlapping region OR may include the first edge portion EP1 and the second edge portion EP2 having a lower height of the second electrode 230 than a height of the second electrode 230 disposed at the central portion CP so that a local density of the resonance portion 200 changes. Thus, a lateral wave may be reflected toward the central portion CP of the resonance portion 200, and a lateral wave generated in the central portion CP of the resonance portion 200 may be returned to the central portion CP without being diffused to the outside of the edge portion EP of the resonance portion 200. Therefore, it is possible to prevent resonance energy generated in the central portion CP of the resonance portion 200 from being lost (or leaked) to the outside.

In addition, according to the bulk acoustic resonator 105 of the present embodiment, the edge portion EP disposed to surround the central portion CP of the overlapping region OR may further include not only the first edge portion EP1 and the second edge portion EP2 having a lower height of the second electrode 230 than a height of the second electrode 230 disposed at the central portion CP but also the protruding portion FP disposed outside the second edge portion EP2. Thus, a sound wave may be attenuated in the protruding portion FP to suppress leakage of energy to the outside of the resonance portion 200.

According to the bulk acoustic resonator 105 of the present embodiment, the edge portion EP may include the first edge portion EP1 and the second edge portion EP2 having different heights, and a size of the acoustic displacement of the edge portion EP may be determined by a combination of the acoustic displacement of the first edge portion EP1 and the acoustic displacement of the second edge portion EP2. Therefore, even if a depth and a width of any one of the first edge portion EP1 and the second edge portion EP2 of the edge portion EP change, an influence of a change in the depth or the width of the edge portion may be relatively small compared with a case where the edge portion EP is made of one region.

Therefore, according to the bulk acoustic resonator 105 of the present embodiment, it is possible to reduce an influence of the acoustic displacement due to the process error of the edge portion EP, the change in the resonance characteristic of the central portion CP of the resonance portion 200 may be reduced, and deterioration of performance of the resonator may be reduced.

Figure 8:
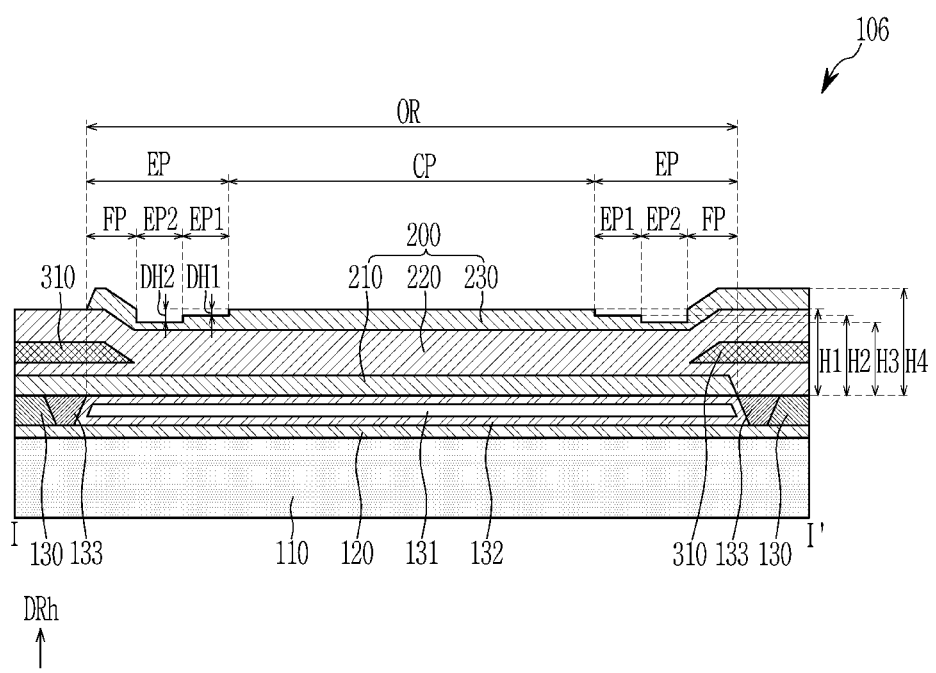
FIG. 8 is a cross-sectional view of a bulk acoustic resonator according to another embodiment.

Referring to FIG. 8, a bulk acoustic resonator 106 according to another embodiment will be described. FIG. 8 is a cross-sectional view of the bulk acoustic resonator according to the other embodiment.

Referring to FIG. 8, the bulk acoustic resonator 106 according to the present embodiment is similar to the bulk acoustic resonators 100, 101, 102, 103, 104, or 105 according to the above-described embodiments. A detailed description of the same constituent elements is omitted.

As shown in FIG. 8, the bulk acoustic resonator 106 according to the present embodiment may include the substrate 110, the resonance portion 200 disposed above the substrate 110, the insulating layer 120 and the cavity 131 disposed between the substrate 110 and the resonance portion 200, and the support layer 130 and the etching prevention portion 133 surrounding the cavity 131.

The resonance portion 200 may include the first electrode 210, the piezoelectric layer 220, and the second electrode 230 sequentially disposed along the height direction DRh to overlap each other. The piezoelectric layer 220 of the resonance portion 200 may be disposed between the first electrode 210 and the second electrode 230.

The resonance portion 200 may resonate the piezoelectric layer 220 according to signals applied to the first electrode 210 and the second electrode 230 to generate a resonance frequency and an anti-resonance frequency.

The resonance portion 200 may include the overlapping region OR in which the first electrode 210, the piezoelectric layer 220, and the second electrode 230 overlap along the height direction DRh, and resonance of the resonance portion 200 may mainly occur in the overlapping region OR.

The overlapping region OR may include the central portion CP where a surface of the second electrode 230 is approximately flat and the edge portion EP disposed at an edge of the central portion CP.

The central portion CP may be a region disposed at a center of the resonance portion 200, and the edge portion EP may be a region disposed along a circumference of the central portion CP.

The edge portion EP may include the first edge portion EP1, the second edge portion EP2, and the protruding portion FP having different heights of the second electrode 230 measured from the lower surface of the resonance portion 200 along the height direction DRh.

The protruding portion FP of the edge portion EP may be disposed further outside the central portion CP than the first edge portion EP1 and the second edge portion EP2.

The height H2 or H3 of the second electrode 230 of the edge portion EP measured from a lower surface of the resonance portion 200 along the height direction DRh may be lower than the first height H1 of the second electrode 230 of the central portion CP of the resonance portion 200 measured from the lower surface of the resonance portion 200 along the height direction DRh.

The second height H2 of the second electrode 230 of the first edge portion EP1 and the third height H3 of the second electrode 230 of the second edge portion EP2 measured from the lower surface of the resonance portion 200 along the height direction DRh may be lower than the first height H1 of the second electrode 230 of the central portion CP of the resonance portion 200 measured from the lower surface of the resonance portion 200 along the height direction DRh. The third height H3 of the second electrode 230 of the second edge portion EP2 may be lower than the second height H2 of the second electrode 230 of the first edge portion EP1.

The second height difference DH2 between the first height H1 of the central portion CP and the third height H3 of the second edge portion EP2 may be greater than the first height difference DH1 between the first height H1 of the central portion CP and the second height H2 of the first edge portion EP1. That is, the height of the upper surface of the second electrode 230 of the first edge portion EP1 may be lower than the height of the upper surface of the second electrode 230 of the central portion CP, the height of the upper surface of the second electrode 230 of the second edge portion EP2 may be lower than the height of the upper surface of the second electrode 230 of the central portion CP, and the height of the upper surface of the second electrode 230 of the second edge portion EP2 may be lower than the height of the upper surface of the second electrode 230 of the first edge portion EP1.

The fourth height H4 of the protruding portion FP measured from the lower surface of the resonance portion 200 along the height direction DRh may be higher than the first height H1 of the central portion CP.

Similar to the bulk acoustic resonator 105 according to the embodiment described with reference to FIG. 7, the insertion layer 310 may overlap the protruding portion FP of the edge portion EP.

However, unlike the bulk acoustic resonator 105 according to the embodiment described with reference to FIG. 7, the insertion layer 310 may be disposed inside the piezoelectric layer 220.

A thickness of the insertion layer 310 may increase as the insertion layer 310 extends away from the central portion CP, and a side surface adjacent to the central portion CP of the insertion layer 310 may have an inclined surface shape having a constant inclination angle. The protruding portion FP may have a shape in which an upper surface is raised along a shape of the insertion layer 310.

The insertion layer 310 may be disposed around the central portion CP to support the protruding portion FP.

The insertion layer 310 may be disposed at a region other than the central portion CP. For example, the insertion layer 310 may be disposed at an entire region except for the central portion CP above the substrate 110, or may be disposed at a portion of the entire region such as the edge region EP.

Similar to the bulk acoustic resonators 100 and 103 according to the embodiments described above with reference to FIGS. 2 and 5, a thickness of the second electrode 230 disposed at the central portion CP of the overlapping region OR of the bulk acoustic resonator 106 according to the present embodiment may be greater than that of the second electrode 230 disposed at the edge portion EP, and a thickness of the second electrode 230 disposed at the first edge portion EP1 may be greater than a thickness of the second electrode 230 disposed at the second edge portion EP2.

A thickness of the second electrode 230 disposed at the protruding portion FP of the bulk acoustic resonator 106 according to the present embodiment may be almost the same as that of the second electrode 230 disposed at the central portion CP.

A difference between the first height H1 of the central portion CP, the second height H2 of the first edge portion EP1, and the third height H3 of the second edge portion EP2 of the bulk acoustic resonator 106 according to the present embodiment may be adjusted by a thickness of the second electrode 230, and the fourth height H4 of the protruding portion FP may be adjusted by a thickness of the insertion layer 310.

According to the bulk acoustic resonator 106 of the present embodiment, the edge portion EP disposed to surround the central portion CP of the resonance portion 200 may include the first edge portion EP1 and the second edge portion EP2 having a lower height of the second electrode 230 than a height of the second electrode 230 disposed at the central portion CP so that a local density of the resonance portion 200 changes. Thus, a lateral wave may be reflected toward the central portion CP of the resonance portion 200, and a lateral wave generated in the central portion CP of the resonance portion 200 may be returned to the central portion CP without being diffused to the outside of the edge portion EP of the resonance portion 200. Therefore, it is possible to prevent resonance energy generated in the central portion CP of the resonance portion 200 from being lost (or leaked) to the outside.

In addition, according to the bulk acoustic resonator 106 of the present embodiment, the edge portion EP disposed to surround the central portion CP of the overlapping region OR may further include not only the first edge portion EP1 and the second edge portion EP2 having a lower height of the second electrode 230 than a height of the second electrode 230 disposed at the central portion CP but also the protruding portion FP disposed outside the second edge portion EP2. Thus, a sound wave may be attenuated in the protruding portion FP to suppress leakage of energy to the outside of the resonance portion 200.

According to the bulk acoustic resonator 106 of the present embodiment, the edge portion EP may include the first edge portion EP1 and the second edge portion EP2 having different heights, and a size of the acoustic displacement of the edge portion EP may be determined by a combination of the acoustic displacement of the first edge portion EP1 and the acoustic displacement of the second edge portion EP2. Therefore, even if a depth and a width of any one of the first edge portion EP1 and the second edge portion EP2 of the edge portion EP change, an influence of a change in the depth or the width of the edge portion may be relatively small compared with a case where the edge portion EP is made of one region.

Therefore, according to the bulk acoustic resonator 106 of the present embodiment, it is possible to reduce an influence of the acoustic displacement due to the process error of the edge portion EP, the change in the resonance characteristic of the central portion CP of the resonance portion 200 may be reduced, and deterioration of performance of the resonator may be reduced.

Figure 9:
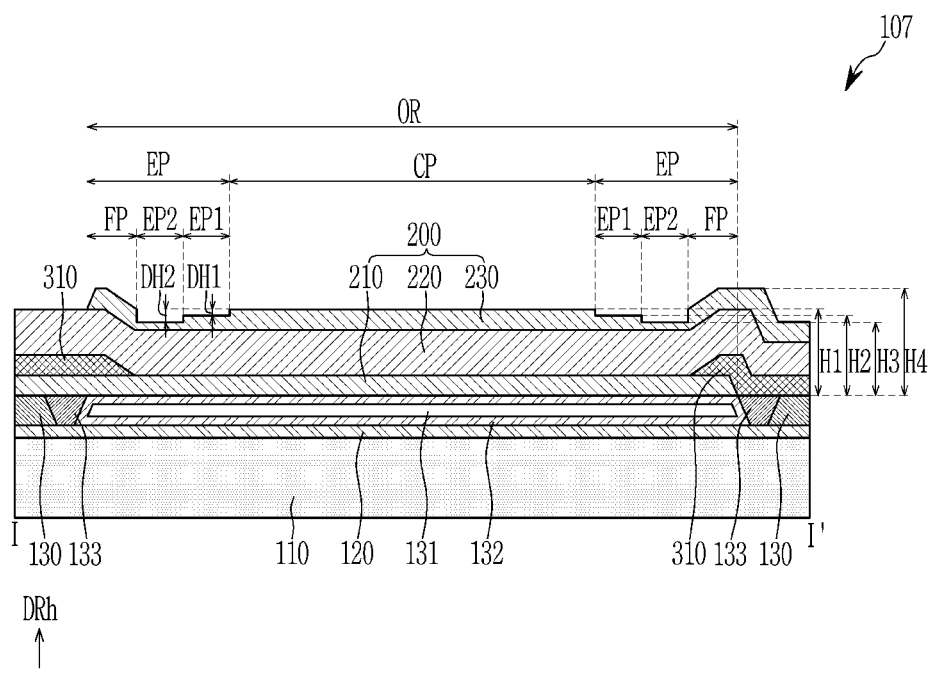
FIG. 9 is a cross-sectional view of a bulk acoustic resonator according to another embodiment.

Referring to FIG. 9, a bulk acoustic resonator 107 according to another embodiment will be described. FIG. 9 is a cross-sectional view of the bulk acoustic resonator according to the other embodiment.

Referring to FIG. 9, the bulk acoustic resonator 107 according to the present embodiment is similar to the bulk acoustic resonators 100, 101, 102, 103, 104, 105, or 106 according to the above-described embodiments. A detailed description of the same constituent elements is omitted.

As shown in FIG. 9, the bulk acoustic resonator 107 according to the present embodiment may include the substrate 110, the resonance portion 200 disposed above the substrate 110, the insulating layer 120 and the cavity 131 disposed between the substrate 110 and the resonance portion 200, and the support layer 130 and the etching prevention portion 133 surrounding the cavity 131.

The resonance portion 200 may include the first electrode 210, the piezoelectric layer 220, and the second electrode 230 sequentially disposed along the height direction DRh to overlap each other. The piezoelectric layer 220 of the resonance portion 200 may be disposed between the first electrode 210 and the second electrode 230.

The resonance portion 200 may resonate the piezoelectric layer 220 according to signals applied to the first electrode 210 and the second electrode 230 to generate a resonance frequency and an anti-resonance frequency.

The resonance portion 200 may include the overlapping region OR in which the first electrode 210, the piezoelectric layer 220, and the second electrode 230 overlap along the height direction DRh, and resonance of the resonance portion 200 may mainly occur in the overlapping region OR.

The overlapping region OR may include the central portion CP where a surface of the second electrode 230 is approximately flat and the edge portion EP disposed at an edge of the central portion CP.

The central portion CP may be a region disposed at a center of the resonance portion 200, and the edge portion EP may be a region disposed along a circumference of the central portion CP.

The edge portion EP may include the first edge portion EP1, the second edge portion EP2, and the protruding portion FP having different heights of the second electrode 230 measured from the lower surface of the resonance portion 200 along the height direction DRh.

The protruding portion FP of the edge portion EP may be disposed further outside the central portion CP than the first edge portion EP1 and the second edge portion EP2.

The height H2 or H3 of the second electrode 230 of the edge portion EP measured from a lower surface of the resonance portion 200 along the height direction DRh may be lower than the first height H1 of the second electrode 230 of the central portion CP of the resonance portion 200 measured from the lower surface of the resonance portion 200 along the height direction DRh.

The second height H2 of the second electrode 230 of the first edge portion EP1 and the third height H3 of the second electrode 230 of the second edge portion EP2 measured from the lower surface of the resonance portion 200 along the height direction DRh may be lower than the first height H1 of the second electrode 230 of the central portion CP of the resonance portion 200 measured from the lower surface of the resonance portion 200 along the height direction DRh. The third height H3 of the second electrode 230 of the second edge portion EP2 may be lower than the second height H2 of the second electrode 230 of the first edge portion EP1.

The second height difference DH2 between the first height H1 of the central portion CP and the third height H3 of the second edge portion EP2 may be greater than the first height difference DH1 between the first height H1 of the central portion CP and the second height H2 of the first edge portion EP1. That is, the height of the upper surface of the second electrode 230 of the first edge portion EP1 may be lower than the height of the upper surface of the second electrode 230 of the central portion CP, the height of the upper surface of the second electrode 230 of the second edge portion EP2 may be lower than the height of the upper surface of the second electrode 230 of the central portion CP, and the height of the upper surface of the second electrode 230 of the second edge portion EP2 may be lower than the height of the upper surface of the second electrode 230 of the first edge portion EP1.

The fourth height H4 of the protruding portion FP measured from the lower surface of the resonance portion 200 along the height direction DRh may be higher than the first height H1 of the central portion CP.

Similar to the bulk acoustic resonators 105 and 106 according to the embodiments described with reference to FIGS. 7 and 8, the insertion layer 310 may overlap the protruding portion FP of the edge portion EP.

However, unlike the bulk acoustic resonators 105 and 106 according to the embodiments described with reference to FIGS. 7 and 8, the insertion layer 310 may be disposed between the first electrode 210 and the piezoelectric layer 220.

A thickness of the insertion layer 310 may increase as the insertion layer 310 extends away from the central portion CP, and a side surface adjacent to the central portion CP of the insertion layer 310 may have an inclined surface shape having a constant inclination angle. The protruding portion FP may have a shape in which an upper surface is raised along a shape of the insertion layer 310.

The insertion layer 310 may be disposed around the central portion CP to support the protruding portion FP.

The insertion layer 310 may be disposed at a region other than the central portion CP. For example, the insertion layer 310 may be disposed at an entire region except for the central portion CP above the substrate 110, or may be disposed at a portion of the entire region such as the edge region EP.

Similar to the bulk acoustic resonators 100 and 103 according to the embodiments described above with reference to FIGS. 2 and 5, a thickness of the second electrode 230 disposed at the central portion CP of the overlapping region OR of the bulk acoustic resonator 107 according to the present embodiment may be greater than that of the second electrode 230 disposed at the edge portion EP, and a thickness of the second electrode 230 disposed at the first edge portion EP1 may be greater than a thickness of the second electrode 230 disposed at the second edge portion EP2.

A thickness of the second electrode 230 disposed at the protruding portion FP of the bulk acoustic resonator 107 according to the present embodiment may be almost the same as that of the second electrode 230 disposed at the central portion CP.

A difference between the first height H1 of the central portion CP, the second height H2 of the first edge portion EP1, and the third height H3 of the second edge portion EP2 of the bulk acoustic resonator 107 according to the present embodiment may be adjusted by a thickness of the second electrode 230, and the fourth height H4 of the protruding portion FP may be adjusted by a thickness of the insertion layer 310.

According to the bulk acoustic resonator 107 of the present embodiment, the edge portion EP disposed to surround the central portion CP of the resonance portion 200 may include the first edge portion EP1 and the second edge portion EP2 having a lower height of the second electrode 230 than a height of the second electrode 230 disposed at the central portion CP so that a local density of the resonance portion 200 changes. Thus, a lateral wave may be reflected toward the central portion CP of the resonance portion 200, and a lateral wave generated in the central portion CP of the resonance portion 200 may be returned to the central portion CP without being diffused to the outside of the edge portion EP of the resonance portion 200. Therefore, it is possible to prevent resonance energy generated in the central portion CP of the resonance portion 200 from being lost (or leaked) to the outside.

In addition, according to the bulk acoustic resonator 107 of the present embodiment, the edge portion EP disposed to surround the central portion CP of the overlapping region OR may further include not only the first edge portion EP1 and the second edge portion EP2 having a lower height of the second electrode 230 than a height of the second electrode 230 disposed at the central portion CP but also the protruding portion FP disposed outside the second edge portion EP2. Thus, a sound wave may be attenuated in the protruding portion FP to suppress leakage of energy to the outside of the resonance portion 200.

According to the bulk acoustic resonator 107 of the present embodiment, the edge portion EP may include the first edge portion EP1 and the second edge portion EP2 having different heights, and a size of the acoustic displacement of the edge portion EP may be determined by a combination of the acoustic displacement of the first edge portion EP1 and the acoustic displacement of the second edge portion EP2. Therefore, even if a depth and a width of any one of the first edge portion EP1 and the second edge portion EP2 of the edge portion EP change, an influence of a change in the depth or the width of the edge portion may be relatively small compared with a case where the edge portion EP is made of one region.

Therefore, according to the bulk acoustic resonator 107 of the present embodiment, it is possible to reduce an influence of the acoustic displacement due to the process error of the edge portion EP, the change in the resonance characteristic of the central portion CP of the resonance portion 200 may be reduced, and deterioration of performance of the resonator may be reduced.

Figure 10:
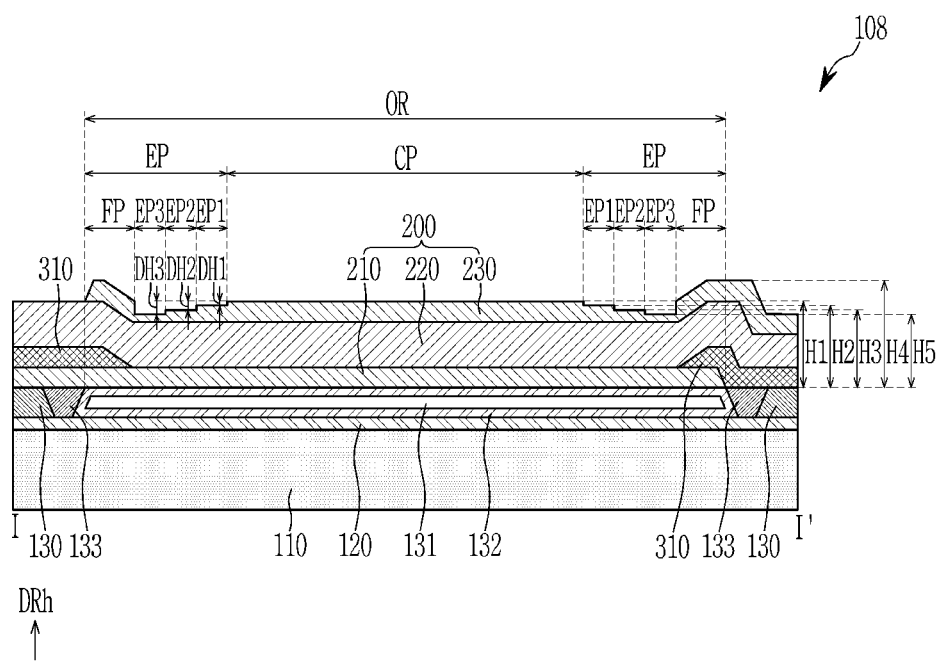
FIG. 10 is a cross-sectional view of a bulk acoustic resonator according to another embodiment.

Referring to FIG. 10, a bulk acoustic resonator 108 according to another embodiment will be described. FIG. 10 is a cross-sectional view of the bulk acoustic resonator according to the other embodiment.

Referring to FIG. 10, the bulk acoustic resonator 108 according to the present embodiment is similar to the bulk acoustic resonators 100, 101, 102, 103, 104, 105, 106, or 107 according to the above-described embodiments. A detailed description of the same constituent elements is omitted.

As shown in FIG. 10, the bulk acoustic resonator 108 according to the present embodiment may include the substrate 110, the resonance portion 200 disposed above the substrate 110, the insulating layer 120 and the cavity 131 disposed between the substrate 110 and the resonance portion 200, and the support layer 130 and the etching prevention portion 133 surrounding the cavity 131.

The resonance portion 200 may include the first electrode 210, the piezoelectric layer 220, and the second electrode 230 sequentially disposed along the height direction DRh to overlap each other. The piezoelectric layer 220 of the resonance portion 200 may be disposed between the first electrode 210 and the second electrode 230.

The resonance portion 200 may resonate the piezoelectric layer 220 according to signals applied to the first electrode 210 and the second electrode 230 to generate a resonance frequency and an anti-resonance frequency.

The resonance portion 200 may include the overlapping region OR in which the first electrode 210, the piezoelectric layer 220, and the second electrode 230 overlap along the height direction DRh, and resonance of the resonance portion 200 may mainly occur in the overlapping region OR.

The overlapping region OR may include the central portion CP where a surface of the second electrode 230 is approximately flat and the edge portion EP disposed at an edge of the central portion CP.

The central portion CP may be a region disposed at a center of the resonance portion 200, and the edge portion EP may be a region disposed along a circumference of the central portion CP.

The edge portion EP may include the first edge portion EP1, the second edge portion EP2, a third edge portion EP3, and the protruding portion FP having different heights of the second electrode 230 measured from the lower surface of the resonance portion 200 along the height direction DRh.

A height H2, H3, or H5 of the second electrode 230 of the edge portion EP measured from a lower surface of the resonance portion 200 along the height direction DRh may be lower than the first height H1 of the second electrode 230 of the central portion CP of the resonance portion 200 measured from the lower surface of the resonance portion 200 along the height direction DRh.

Unlike the bulk acoustic resonators 100, 101, 102, 103, 104, 105, 106, or 107 according to the above-described embodiments, the edge portion EP of the bulk acoustic resonator 108 according to the present embodiment may include the first edge portion EP1, the second edge portion EP2, and the third edge portion EP3 having different heights of the second electrode 230 measured from the lower surface of the resonance portion 200 along the height direction DRh.

The second height H2 of the second electrode 230 of the first edge portion EP1, the third height H3 of the second electrode 230 of the second edge portion EP2, and the fifth height H5 of the second electrode 230 of the third edge portion EP3 measured from the lower surface of the resonance portion 200 along the height direction DRh may be lower than the first height H1 of the second electrode 230 of the central portion CP of the resonance portion 200 measured from the lower surface of the resonance portion 200 along the height direction DRh. The third height H3 of the second electrode 230 of the second edge portion EP2 may be lower than the second height H2 of the second electrode 230 of the first edge portion EP1, and the fifth height H5 of the second electrode 230 of the third edge portion EP3 may be lower than the third height H3 of the second electrode 230 of the second edge portion EP2.

The second height difference DH2 between the first height H1 of the central portion CP and the third height H3 of the second edge portion EP2 may be greater than the first height difference DH1 between the first height H1 of the central portion CP and the second height H2 of the first edge portion EP1. The third height difference DH3 between the first height H1 of the central portion CP and the fifth height H5 of the third edge portion EP3 may be greater than the first height difference DH1 and the second height difference DH2.

The fourth height H4 of the protruding portion FP measured from the lower surface of the resonance portion 200 along the height direction DRh may be higher than the first height H1 of the central portion CP.

Similar to the bulk acoustic resonators 105, 106, and 107 according to the embodiments described with reference to FIGS. 7 to 9, the insertion layer 310 may overlap the protruding portion FP of the edge portion EP.

The insertion layer 310 may be disposed between the first electrode 210 and the piezoelectric layer 220, but the present disclosure is not limited thereto.

A thickness of the insertion layer 310 may increase as the insertion layer 310 extends away from the central portion CP, and a side surface adjacent to the central portion CP of the insertion layer 310 may have an inclined surface shape having a constant inclination angle. The protruding portion FP may have a shape in which an upper surface is raised along a shape of the insertion layer 310.

The insertion layer 310 may be disposed around the central portion CP to support the protruding portion FP.

The insertion layer 310 may be disposed at a region other than the central portion CP. For example, the insertion layer 310 may be disposed at an entire region except for the central portion CP above the substrate 110, or may be disposed at a portion of the entire region such as the edge region EP.

Similar to the bulk acoustic resonators 100 and 103 according to the embodiments described above with reference to FIGS. 2 and 5, a thickness of the second electrode 230 disposed at the central portion CP of the resonance portion 200 of the bulk acoustic resonator 108 according to the present embodiment may be greater than that of the second electrode 230 disposed at the edge portion EP, and a thickness of the second electrode 230 disposed at the first edge portion EP1 may be greater than a thickness of the second electrode 230 disposed at the second edge portion EP2.

A thickness of the second electrode 230 disposed at the protruding portion FP of the bulk acoustic resonator 108 according to the present embodiment may be almost the same as that of the second electrode 230 disposed at the central portion CP.

A difference between the first height H1 of the central portion CP, the second height H2 of the first edge portion EP1, the third height H3 of the second edge portion EP2, and the fifth height H5 of the third edge portion EP3 of the bulk acoustic resonator 108 according to the present embodiment may be adjusted by a thickness of the second electrode 230, and the fourth height H4 of the protruding portion FP may be adjusted by a thickness of the insertion layer 310.

According to the bulk acoustic resonator 108 of the present embodiment, the edge portion EP disposed to surround the central portion CP of the resonance portion 200 may include the first edge portion EP1, the second edge portion EP2, and the third edge portion EP3 having a lower height of the second electrode 230 than a height of the second electrode 230 disposed at the central portion CP so that a local density of the resonance portion 200 changes. Thus, a lateral wave may be reflected toward the central portion CP of the resonance portion 200, and a lateral wave generated in the central portion CP of the resonance portion 200 may be returned to the central portion CP without being diffused to the outside of the edge portion EP of the resonance portion 200. Therefore, it is possible to prevent resonance energy generated in the central portion CP of the resonance portion 200 from being lost (or leaked) to the outside.

In addition, according to the bulk acoustic resonator 108 of the present embodiment, the edge portion EP disposed to surround the central portion CP of the overlapping region OR may further include not only the first edge portion EP1, the second edge portion EP2, and the third edge portion EP3 having a lower height of the second electrode 230 than a height of the second electrode 230 disposed at the central portion CP but also the protruding portion FP disposed outside the third edge portion EP3. Thus, a sound wave may be attenuated in the protruding portion FP to suppress leakage of energy to the outside of the resonance portion 200.

According to the bulk acoustic resonator 108 of the present embodiment, the edge portion EP may include the first edge portion EP1, the second edge portion EP2, and the third edge portion EP3 having the different heights, and a size of the acoustic displacement of the edge portion EP may be determined by a combination of the acoustic displacement of the first edge portion EP1, the acoustic displacement of the second edge portion EP2, and an acoustic displacement of the third edge portion EP3. Therefore, even if a depth and a width of any one of the first edge portion EP1, the second edge portion EP2, and the third edge portion EP3 of the edge portion EP change, an influence of a change in the depth or the width of the edge portion may be relatively small compared with a case where the edge portion EP is made of one region.

Therefore, according to the bulk acoustic resonator 108 of the present embodiment, it is possible to reduce an influence of the acoustic displacement due to the process error of the edge portion EP, the change in the resonance characteristic of the central portion CP of the resonance portion 200 may be reduced, and deterioration of performance of the resonator may be reduced.

Figure 11:
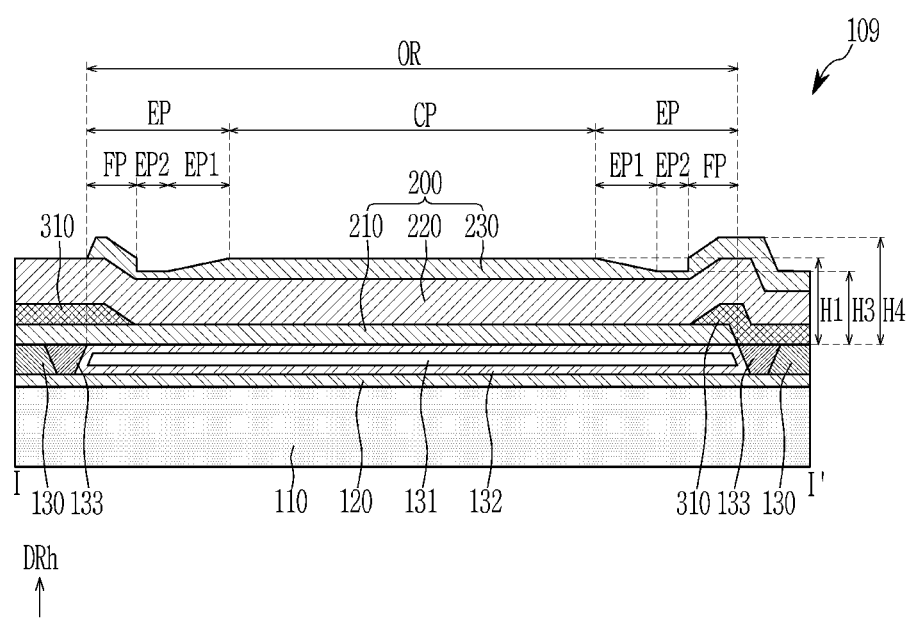
FIG. 11 is a cross-sectional view of a bulk acoustic resonator according to another embodiment.

Referring to FIG. 11, a bulk acoustic resonator 109 according to another embodiment will be described. FIG. 11 is a cross-sectional view of the bulk acoustic resonator according to the other embodiment.

Referring to FIG. 11, the bulk acoustic resonator 109 according to the present embodiment is similar to the bulk acoustic resonators 100, 101, 102, 103, 104, 105, 106, 107, or 108 according to the above-described embodiments. A detailed description of the same constituent elements is omitted.

As shown in FIG. 11, the bulk acoustic resonator 109 according to the present embodiment may include the substrate 110, the resonance portion 200 disposed above the substrate 110, the insulating layer 120 and the cavity 131 disposed between the substrate 110 and the resonance portion 200, and the support layer 130 and the etching prevention portion 133 surrounding the cavity 131.

The resonance portion 200 may include the first electrode 210, the piezoelectric layer 220, and the second electrode 230 sequentially disposed along the height direction DRh to overlap each other. The piezoelectric layer 220 of the resonance portion 200 may be disposed between the first electrode 210 and the second electrode 230.

The resonance portion 200 may resonate the piezoelectric layer 220 according to signals applied to the first electrode 210 and the second electrode 230 to generate a resonance frequency and an anti-resonance frequency.

The resonance portion 200 may include the overlapping region OR in which the first electrode 210, the piezoelectric layer 220, and the second electrode 230 overlap along the height direction DRh, and resonance of the resonance portion 200 may mainly occur in the overlapping region OR.

The overlapping region OR may include the central portion CP where a surface of the second electrode 230 is approximately flat and the edge portion EP disposed at an edge of the central portion CP.

The central portion CP may be a region disposed at a center of the resonance portion 200, and the edge portion EP may be a region disposed along a circumference of the central portion CP.

The edge portion EP may include the first edge portion EP1, the second edge portion EP2, and the protruding portion FP having different heights of the second electrode 230 measured from the lower surface of the resonance portion 200 along the height direction DRh.

The height H2 or H3 of the second electrode 230 of the edge portion EP measured from a lower surface of the resonance portion 200 along the height direction DRh may be lower than the first height H1 of the second electrode 230 of the central portion CP of the resonance portion 200 measured from the lower surface of the resonance portion 200 along the height direction DRh.

The second height H2 of the second electrode 230 of the first edge portion EP1 and the third height H3 of the second electrode 230 of the second edge portion EP2 measured from the lower surface of the resonance portion 200 along the height direction DRh may be lower than the first height H1 of the second electrode 230 of the central portion CP of the resonance portion 200 measured from the lower surface of the resonance portion 200 along the height direction DRh. The third height H3 of the second electrode 230 of the second edge portion EP2 may be lower than the second height H2 of the second electrode 230 of the first edge portion EP1.

The second height difference DH2 between the first height H1 of the central portion CP and the third height H3 of the second edge portion EP2 may be greater than the first height difference DH1 between the first height H1 of the central portion CP and the second height H2 of the first edge portion EP1.

The fourth height H4 of the protruding portion FP measured from the lower surface of the resonance portion 200 along the height direction DRh may be higher than the first height H1 of the central portion CP.

Unlike the bulk acoustic resonators 101, 102, 103, 104, 105, 106, 107, or 108 according to the above-described embodiments, a height of the second electrode 230 of the first edge portion EP1 may not be constant, and the height of the second electrode 230 of the first edge portion EP1 adjacent to the central portion CP of the resonance portion 200 may gradually decrease from a height of the second electrode 230 of the central portion CP to a height of the second electrode 230 of the second edge portion EP2.

Similar to the bulk acoustic resonators 105, 106, 107, and 108 according to the embodiments described with reference to FIGS. 7 to 10, the insertion layer 310 may overlap the protruding portion FP of the edge portion EP.

Like the bulk acoustic resonators 107 and 108 according to the embodiments described with reference to FIGS. 9 and 10, the insertion layer 310 may be disposed between the first electrode 210 and the piezoelectric layer 220. However, the present embodiment is not limited thereto. For example, the insertion layer 310 may be disposed between the piezoelectric layer 220 and the second electrode 230 of the resonance portion 200 or the insertion layer 310 may be disposed inside the piezoelectric layer 220 like the bulk acoustic resonator 105 and the bulk acoustic resonator 106 according to the embodiments described with reference to FIGS. 7 and 8.

A thickness of the insertion layer 310 may increase as the insertion layer 310 extends away from the central portion CP, and a side surface adjacent to the central portion CP of the insertion layer 310 may have an inclined surface shape having a constant inclination angle. The protruding portion FP may have a shape in which an upper surface is raised along a shape of the insertion layer 310.

The insertion layer 310 may be disposed around the central portion CP to support the protruding portion FP.

The insertion layer 310 may be disposed at a region other than the central portion CP. For example, the insertion layer 310 may be disposed at an entire region except for the central portion CP above the substrate 110, or may be disposed at a portion of the entire region.

Similar to the bulk acoustic resonators 100 and 103 according to the embodiments described above with reference to FIGS. 2 and 5, a thickness of the second electrode 230 disposed at the central portion CP of the resonance portion 200 of the bulk acoustic resonator 109 according to the present embodiment may be greater than that of the second electrode 230 disposed at the edge portion EP, and a thickness of the second electrode 230 disposed at the first edge portion EP1 may be greater than a thickness of the second electrode 230 disposed at the second edge portion EP2.

Unlike the bulk acoustic resonators 101, 102, 103, 104, 105, 106, 107, or 108 according to the above-described embodiments, a thickness of the second electrode 230 of the first edge portion EP1 may not be constant, and a thickness of the second electrode 230 of the first edge portion EP1 may gradually decrease from the second electrode 230 of the central portion CP to the second electrode 230 of the second edge portion EP2.

A thickness of the second electrode 230 disposed at the protruding portion FP of the bulk acoustic resonator 109 according to the present embodiment may be almost the same as that of the second electrode 230 disposed at the central portion CP.

A difference between the first height H1 of the central portion CP, the second height H2 of the first edge portion EP1, and the third height H3 of the second edge portion EP2 of the bulk acoustic resonator 109 according to the present embodiment may be adjusted by a thickness of the second electrode 230, and the fourth height H4 of the protruding portion FP may be adjusted by a thickness of the insertion layer 310.

According to the bulk acoustic resonator 109 of the present embodiment, the edge portion EP disposed to surround the central portion CP of the resonance portion 200 may include the first edge portion EP1 and the second edge portion EP2 having a lower height of the second electrode 230 than a height of the second electrode 230 disposed at the central portion CP so that a local density of the resonance portion 200 changes. Thus, a lateral wave may be reflected toward the central portion CP of the resonance portion 200, and a lateral wave generated in the central portion CP of the resonance portion 200 may be returned to the central portion CP without being diffused to the outside of the edge portion EP of the resonance portion 200. Therefore, it is possible to prevent resonance energy generated in the central portion CP of the resonance portion 200 from being lost (or leaked) to the outside.

In addition, according to the bulk acoustic resonator 109 of the present embodiment, the edge portion EP disposed to surround the central portion CP of the overlapping region OR may further include not only the first edge portion EP1 and the second edge portion EP2 having a lower height of the second electrode 230 than a height of the second electrode 230 disposed at the central portion CP but also the protruding portion FP disposed outside the second edge portion EP2. Thus, a sound wave may be attenuated in the protruding portion FP to suppress leakage of energy to the outside of the resonance portion 200.

According to the bulk acoustic resonator 109 of the present embodiment, the edge portion EP may include the first edge portion EP1 and the second edge portion EP2 having different heights, and a size of the acoustic displacement of the edge portion EP may be determined by a combination of the acoustic displacement of the first edge portion EP1 and the acoustic displacement of the second edge portion EP2. Therefore, even if a depth and a width of any one of the first edge portion EP1 and the second edge portion EP2 of the edge portion EP change, an influence of a change in the depth or the width of the edge portion may be relatively small compared with a case where the edge portion EP is made of one region.

Therefore, according to the bulk acoustic resonator 109 of the present embodiment, it is possible to reduce an influence of the acoustic displacement due to the process error of the edge portion EP, the change in the resonance characteristic of the central portion CP of the resonance portion 200 may be reduced, and deterioration of performance of the resonator may be reduced.

Figure 12:
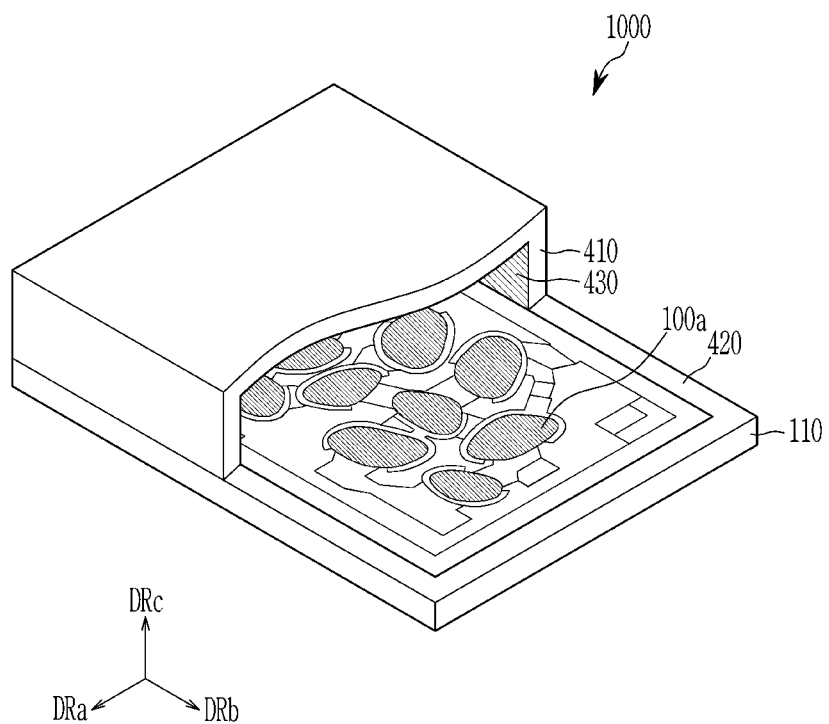
FIG. 12 is a perspective view of a bulk acoustic resonator filter package according to an embodiment.

Referring to FIG. 12, a bulk acoustic resonator filter including the bulk acoustic resonator according to an embodiment will be described. FIG. 12 is a perspective view of a bulk acoustic resonator filter package according to an embodiment.

Referring to FIG. 12, the bulk acoustic resonator filter package 1000 according to the present embodiment may include the substrate 110, a cap 410, a plurality of acoustic resonators 100a, and a bonding member 420.

As described above, the substrate 110 may have a cavity formed below the plurality of acoustic resonators 100a.

The cap 410 may protect the plurality of acoustic resonators 100a from an external environment by accommodating the plurality of acoustic resonators 100a. The cap 410 may be formed in a form of a cover having an inner space in which the plurality of acoustic resonators 100a are accommodated.

Each of the plurality of acoustic resonators 100a may include the first electrode, the piezoelectric layer, and the second electrode stacked in a direction DRc in which the substrate 110 and the cap 410 face each other, and may be accommodated between the substrate 110 and the cap 410.

The bonding member 420 may surround the plurality of acoustic resonators 100a along planar directions DRa and DRb, and may be bonded to the cap 410 between the substrate 110 and the cap 410. For example, the bonding member 420 may be formed of a eutectic bonding structure, an anodic bonding structure, or a melt bonding structure of a non-conductive material, but the present disclosure is not limited thereto. The bonding member 420 may include a conductive ring.

A shield layer 430 may be disposed on a surface of the cap 410 facing the plurality of acoustic resonators 100a, and may be electrically connected to the bonding member 420. Since the shield layer 430 blocks electromagnetic noise received from the outside of the bulk acoustic resonator filter package by the plurality of acoustic resonators 100a, performance of the bulk acoustic resonator filter package may be efficiently improved.

The shield layer 430 may be electrically connected to a ground portion.

Many features of the bulk acoustic resonators according to the bulk acoustic resonators 100, 101, 102, 103, 104, 105, 106, 107, 108, and 109 described above with reference to FIGS. 2 to 11 are applicable to the bulk acoustic resonator filter package 1000.

Figure 13:
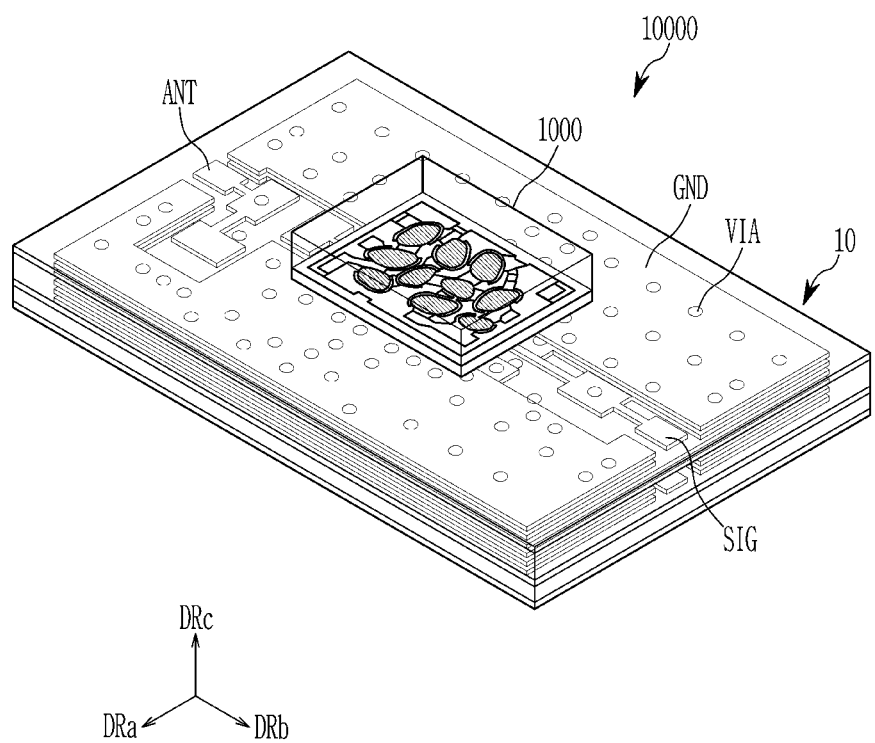
FIG. 13 is a perspective view illustrating a package substrate including the bulk acoustic resonator filter package of FIG. 12.

Referring to FIG. 13, a bulk acoustic resonator filter package substrate 10000 according to an embodiment will be described. FIG. 13 is a perspective view illustrating a package substrate including the bulk acoustic resonator filter package of FIG. 12.

Referring to FIG. 13, the bulk acoustic resonator filter package substrate 10000 according to the embodiment may include the bulk acoustic resonator filter package 1000 disposed at a set substrate 10. For example, the bulk acoustic resonator filter package 1000 may be mounted on the set substrate 10 or may be embedded in the set substrate 10.

The set substrate 10 may be a printed circuit board at which a plurality of conductive layers and a plurality of insulating layers are alternately stacked, the plurality of conductive layers may include an antenna transmission path ANT, a transceiver transmission path SIG, and a ground portion GND, and a plurality of vias VIA may electrically connect the plurality of conductive layers in the direction DRc.

The antenna transmission path ANT and the transceiver transmission path SIG may be electrically connected to an RF port of the bulk acoustic resonator filter package 1000.

Many features of the bulk acoustic resonators 100, 101, 102, 103, 104, 105, 106, 107, 108, and 109 described above with reference to FIGS. 2 to 11 may be applied to the bulk acoustic resonator filter package 1000 of the bulk acoustic resonator filter package substrate 10000.

Figure 14:
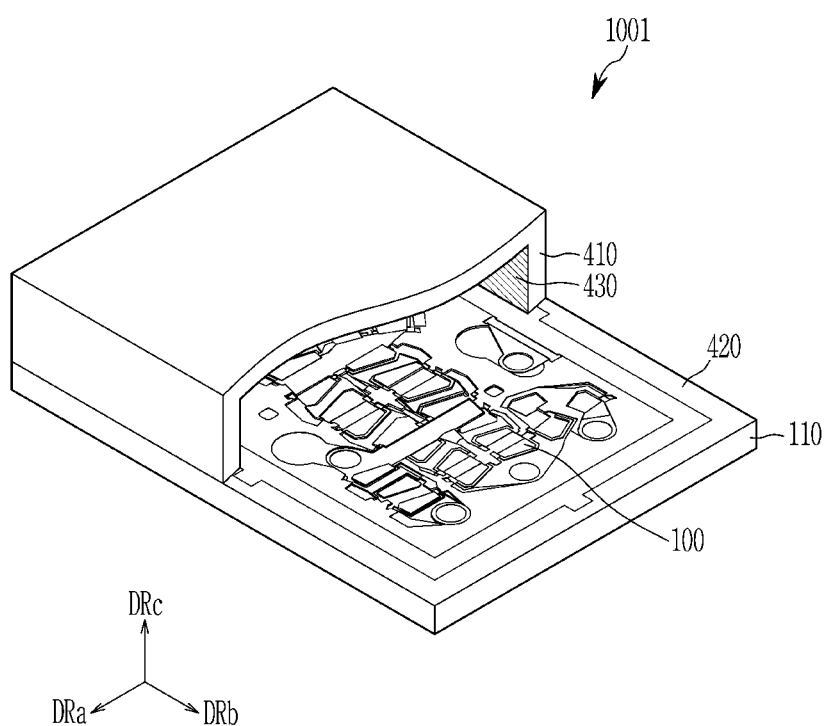
FIG. 14 is a perspective view of a bulk acoustic resonator filter package according to another embodiment.
Figure 15:
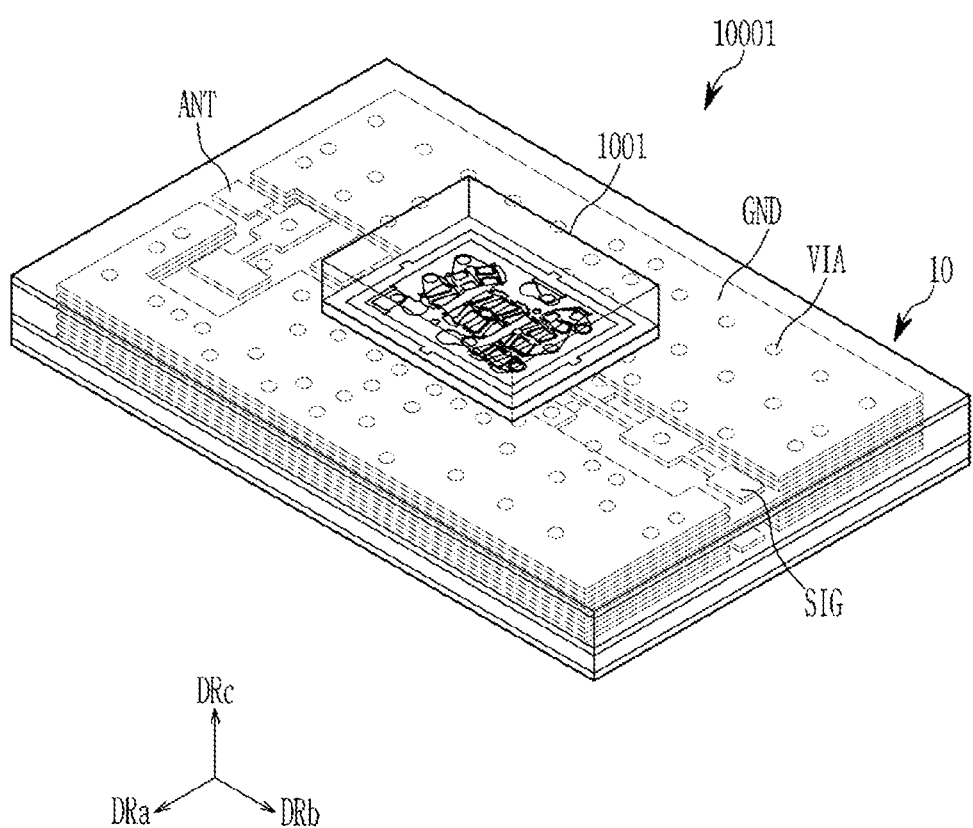
FIG. 15 is a perspective view illustrating a package substrate including the bulk acoustic resonator filter package of FIG. 14.

Referring to FIGS. 14 and 15, a bulk acoustic resonator filter package 1001 and a bulk acoustic resonator filter package substrate 10001 according to another embodiment will be described. FIG. 14 is a perspective view of the bulk acoustic resonator filter package according to the other embodiment, and FIG. 15 is a perspective view illustrating a package substrate including the bulk acoustic resonator filter package of FIG. 14.

Referring to FIG. 14, similar to the bulk acoustic resonator filter package 1000 according to the embodiment described above with reference to FIG. 12, the bulk acoustic resonator filter package 1001 according to the present embodiment may include the substrate 110, the cap 410, a plurality of acoustic resonators 100, and the bonding member 420. A detailed description of the same constituent elements is omitted.

Many features of the bulk acoustic resonators 100, 101, 102, 103, 104, 105, 106, 107, 108, and 109 described above with reference to FIGS. 2 to 11 may be applied to the bulk acoustic resonator filter package 1001.

Referring to FIG. 15, similar to the bulk acoustic resonator filter package substrate 10000 according to the embodiment described with reference to FIG. 13, the bulk acoustic resonator filter package substrate 10001 according to the present embodiment may include the bulk acoustic resonator filter package 1001 disposed at the set substrate 10. For example, the bulk acoustic resonator filter package 1001 may be mounted on the set substrate 10 or may be embedded in the set substrate 10.

The set substrate 10 may be a printed circuit board at which a plurality of conductive layers and a plurality of insulating layers are alternately stacked, the plurality of conductive layers may include an antenna transmission path ANT, a transceiver transmission path SIG, and a ground portion GND, and a plurality of vias VIA may electrically connect the plurality of conductive layers in the direction DRc.

The antenna transmission path ANT and the transceiver transmission path SIG may be electrically connected to an RF port of the bulk acoustic resonator filter package 1001.

A planar shape, the number, and a disposition of the plurality of acoustic resonators 100 of the bulk acoustic resonator filter package 1001 according to the present embodiment may be different from those of the bulk acoustic resonator filter package 1000 according to the embodiment described above.

Many features of the bulk acoustic resonators 100, 101, 102, 103, 104, 105, 106, 107, 108, and 109 described above with reference to FIGS. 2 to 11 may be applied to the bulk acoustic resonator filter package 1001 of the bulk acoustic resonator filter package substrate 10001.

Figure 16:
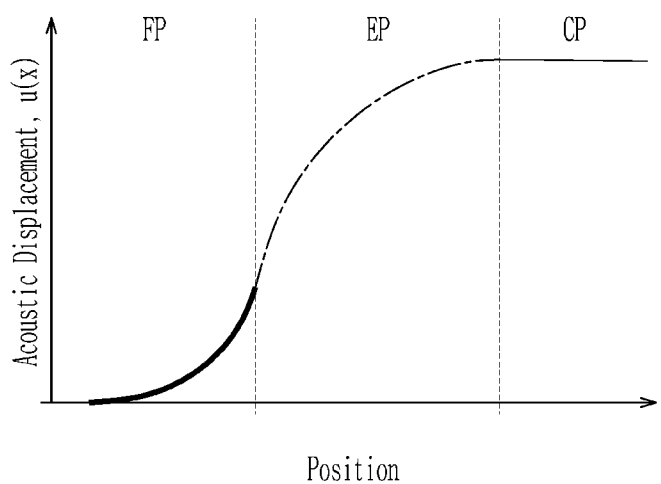
FIGS. 16 to 21 are acoustic displacement graphs illustrating results of experimental examples.
Figure 17:
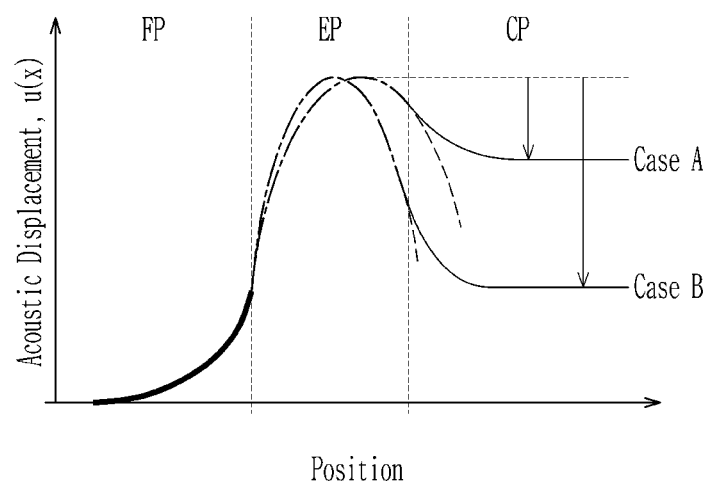
Figure 18:
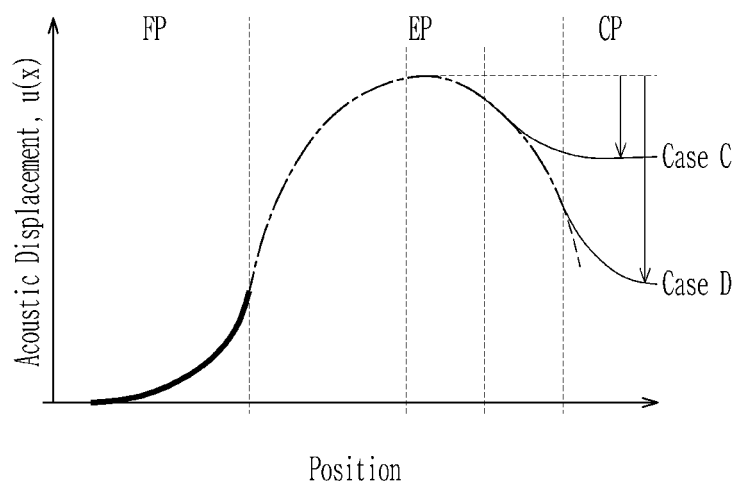
Figure 19:
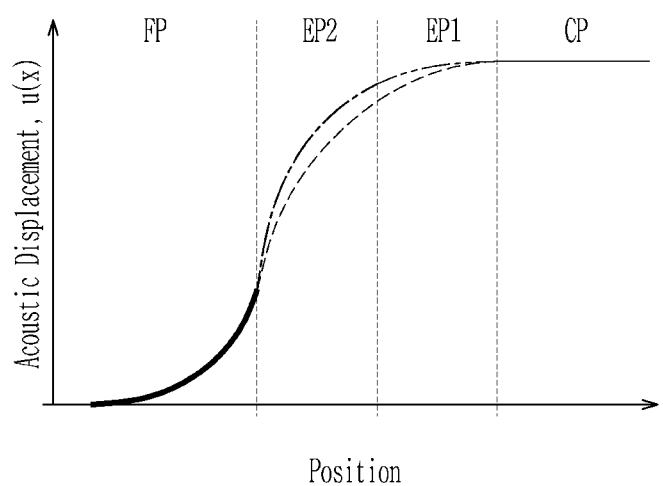
Figure 20:
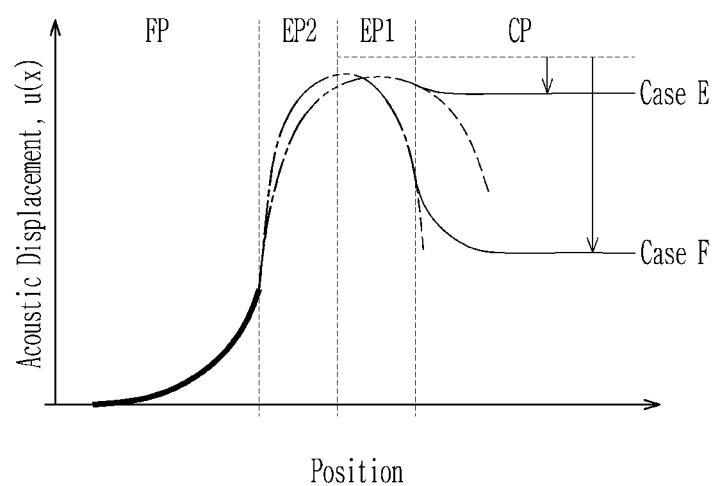
Figure 21:
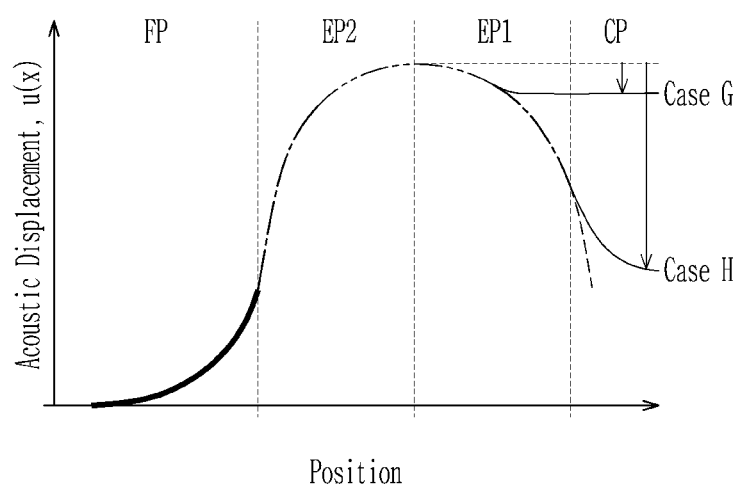

Experimental examples will be described with reference to FIGS. 16 to 18 where a height (or a depth) and a width of the edge portion are changed in the present experimental examples of a conventional art, and FIGS. 19 to 21 where the edge portion EP including the first edge portion EP1 and the second edge portion EP2 having different heights is formed and an acoustic displacement of a case in which depths of the first edge portion EP1 and the second edge portion EP2 and widths of the first edge portion EP1 and the second edge portion EP2 are changed in the present experimental examples of the bulk acoustic resonators according to the embodiments of the present disclosure. FIGS. 16 to 18 and 19 to 21 are acoustic displacement graphs illustrating results of the experimental examples.

Results of measuring an acoustic displacement of a first case where one edge portion is formed at an edge of the central portion and an acoustic displacement of a case where a height (or a depth) and a width of the edge portion are changed in the present experimental example of a conventional art, are shown in FIGS. 16 to 18. FIG. 16 shows an acoustic displacement at a position on an x-axis toward the protruding portion, the edge portion, and the central portion when the acoustic displacement of the central portion maintains the piston mode, FIG. 17 shows the acoustic displacement when the depth of the edge portion changes, and FIG. 18 shows the acoustic displacement when the width of the edge portion changes.

In addition, results of measuring an acoustic displacement of a second case in which the edge portion EP including the first edge portion EP1 and the second edge portion EP2 having different heights is formed and an acoustic displacement of a case in which depths of the first edge portion EP1 and the second edge portion EP2 and widths of the first edge portion EP1 and the second edge portion EP2 are changed in the present experimental example of the bulk acoustic resonators according to the above-described embodiments, are shown in FIGS. 19 to 21. FIG. 19 shows an acoustic displacement at a position on an x-axis toward the protruding portion, the edge portion, and the central portion when the acoustic displacement of the central portion maintains the piston mode, FIG. 20 shows the acoustic displacement when the depth of the edge portion changes, and FIG. 21 shows the acoustic displacement when the width of the edge portion changes.

The edge portion and the protruding portion may be determined to maintain the piston mode of the central portion.

Referring to FIG. 16, the central portion CP may have the piston mode state in which the sound wave on the surface of the central portion CP is substantially absent so that spurious resonance is suppressed, the acoustic displacement may be attenuated toward the outside of the protruding portion FP so that energy leakage to the outside is suppressed, and the acoustic displacement of the edge portion EP may continuously change from the acoustic displacement of the central portion CP to the acoustic displacement of the protruding portion FP.

Thus, the depth and the width of the edge portion EP may be adjusted so that the acoustic displacement of the central portion CP is maintained in the piston mode state and the acoustic displacement is attenuated outside the central portion CP. For example, the edge portion EP may have a first depth and a first width.

Referring to FIG. 17, when the depth of the edge portion EP is greater than the first depth, the acoustic displacement of the edge portion EP may change so that the acoustic displacement of the edge portion EP has a lower acoustic displacement than the acoustic displacement of the central portion CP as the acoustic displacement of the edge portion EP approaches the central portion CP. When a case Case A of increasing from the first depth to a second depth is compared with a case Case B of increasing to a third depth greater than the second depth, a magnitude of change in the acoustic displacement of the edge portion EP of the case Case B of increasing to the third depth may be larger than that of the case Case A of increasing to the second depth.

As described above, the acoustic displacement of the edge portion EP may be changed. Therefore, the acoustic displacement of the edge portion EP may affect the acoustic displacement of the central portion CP, and an occurrence of a displacement in a direction opposite to a direction of an acoustic displacement of the piston mode of the central portion CP may be induced so that leakage of resonance energy occurs.

Referring to FIG. 18, when a case Case C in which the width of the edge portion EP increases from the first width to a second width is compared with a case Case D in which the width of the edge portion EP increases to a third width greater than the second width, the acoustic displacement of the edge portion EP may change so that the acoustic displacement of the edge portion EP has a lower acoustic displacement than the acoustic displacement of the central portion CP as the acoustic displacement of the edge portion EP approaches the central portion CP. A magnitude of change in the acoustic displacement of the edge portion EP of the case Case D of increasing to the third width may be larger than that of the case Case C of increasing to the second width.

As described above, the acoustic displacement of the edge portion EP may be changed. Therefore, the acoustic displacement of the edge portion EP may affect the acoustic displacement of the central portion CP, and an occurrence of a displacement in a direction opposite to a direction of an acoustic displacement of the piston mode of the central portion CP may be induced so that leakage of resonance energy occurs.

Referring to FIG. 19, similar to FIG. 16, the central portion CP may have the piston mode state in which the sound wave on the surface of the central portion CP is substantially absent so that spurious resonance is suppressed, the acoustic displacement may be attenuated toward the outside of the protruding portion FP so that energy leakage to the outside is suppressed, and the acoustic displacement of the edge portion EP may continuously change from the acoustic displacement of the central portion CP to the acoustic displacement of the protruding portion FP. The acoustic displacement of the edge portion EP may be determined as a combination of the acoustic displacement of the first edge portion EP1 and the acoustic displacement of the second edge portion EP2.

Thus, the depth and the width of the edge portion EP including the first edge portion EP1 and the second edge portion EP2 may be adjusted so that the acoustic displacement of the central portion CP is maintained in the piston mode state and the acoustic displacement is attenuated outside the central portion CP. For example, the first edge portion EP1 may have a fourth depth and a fourth width, and the second edge portion EP2 may have a fifth depth and a fifth width. The fifth depth of the second edge portion EP2 may be greater than the fourth depth of the first edge portion EP1.

Referring to FIG. 20, when the depths of the first edge portion EP1 and the second edge portion EP2 are greater than the fourth depth and the fifth depth, the acoustic displacement of the edge portion EP including the first edge portion EP1 and the second edge portion EP2 may change so that the acoustic displacement of the edge portion EP has a lower acoustic displacement than the acoustic displacement of the central portion CP as the acoustic displacement of the edge portion EP approaches the central portion CP. A magnitude of change in the acoustic displacement of the edge portion EP of a case Case F of increasing to an eighth depth and a ninth depth greater than a sixth depth and a seventh depth may be larger than that of a case Case E of increasing from the fourth depth and the fifth depth to the sixth depth and the seventh depth.

As described above, the acoustic displacement of the edge portion EP may be changed. Therefore, the acoustic displacement of the edge portion EP may affect the acoustic displacement of the central portion CP, and an occurrence of a displacement in a direction opposite to a direction of an acoustic displacement of the piston mode of the central portion CP may be induced so that leakage of resonance energy occurs.

Referring to FIG. 21, when the widths of the first edge portion EP1 and the second edge portion EP2 are greater than the fourth width and the fifth width, the acoustic displacement of the edge portion EP including the first edge portion EP1 and the second edge portion EP2 may change so that the acoustic displacement of the edge portion EP has a lower acoustic displacement than the acoustic displacement of the central portion CP as the acoustic displacement of the edge portion EP approaches the central portion CP.

When a case Case G in which the widths of the first edge portion EP1 and the second edge portion EP2 increase from the fourth width and the fifth width to a sixth width and a seventh width is compared with a case Case H in which the widths of the first edge portion EP1 and the second edge portion EP2 increase to an eighth width and a ninth width greater than the sixth width and the seventh width, the acoustic displacement of the edge portion EP may change so that the acoustic displacement of the edge portion EP has a lower acoustic displacement than the acoustic displacement of the central portion CP as the acoustic displacement of the edge portion EP approaches the central portion CP. A magnitude of change in the acoustic displacement of the edge portion EP of the case Case H of increasing to the eighth width and the ninth width may be larger than that of the case Case G of increasing to the sixth width and the seventh width.

As described above, the acoustic displacement of the edge portion EP may be changed. Therefore, the acoustic displacement of the edge portion EP may affect the acoustic displacement of the central portion CP, and an occurrence of a displacement in a direction opposite to a direction of an acoustic displacement of the piston mode of the central portion CP may be induced so that leakage of resonance energy occurs.

Referring to FIG. 20 together with FIG. 17, when the depth of the edge portion changes, a fluctuation value of the acoustic displacement of the edge portion of the second case (FIG. 20) in which the edge portion EP including the first edge portion EP1 and the second edge portion EP2 having different heights is formed of the bulk acoustic resonators according to the above-described embodiments may be smaller than that of the first case (FIG. 17) where one edge portion is formed at the edge of the central portion of the conventional art.

Similarly, referring to FIG. 21 together with FIG. 18, when the depth of the edge portion changes, a fluctuation value of the acoustic displacement of the edge portion of the second case (FIG. 21) in which the edge portion EP including the first edge portion EP1 and the second edge portion EP2 having different heights is formed of the bulk acoustic resonators according to the above-described embodiments may be smaller than that of the first case (FIG. 18) where one edge portion is formed at the edge of the central portion of the conventional art.

Figure 22:
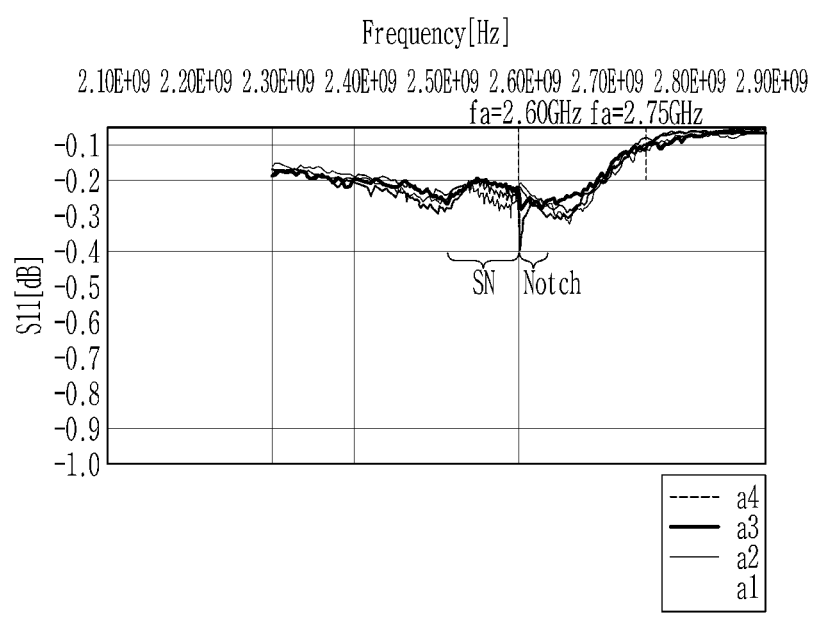
FIGS. 22 and 23 are graphs illustrating results of other experimental examples.
Figure 23:
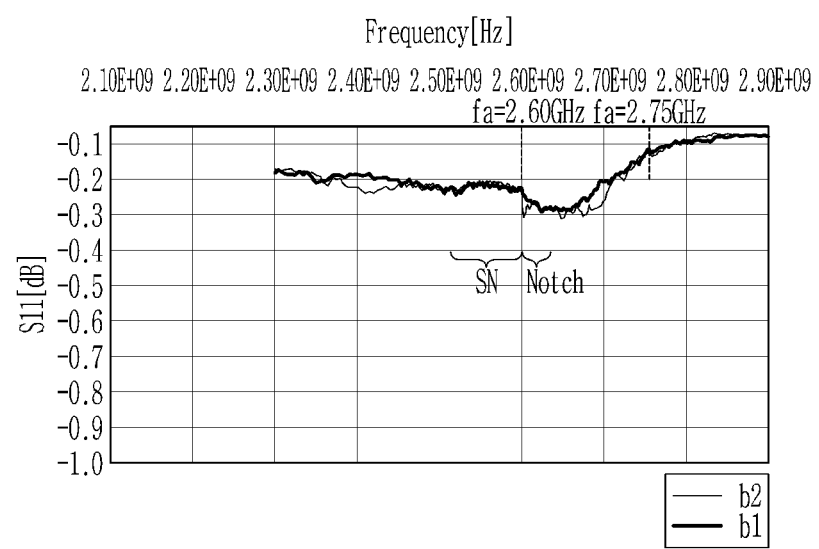

Referring to FIGS. 22 and 23, other experimental examples will be described. FIGS. 22 and 23 are graphs illustrating results of the other experimental examples.

A waveform change with respect to a frequency of S11 (dB) for a case a1 in which a depth of the edge portion of the first case where one edge portion is formed at the edge of the central portion is formed as about 70 Å and a width of the edge portion of the first case is formed as about 2.8 μm, a case a2 in which the depth of the edge portion of the first case is formed as about 70 Å and the width of the edge portion of the first case is formed as about 3.2 μm, a case a3 in which the depth of the edge portion of the first case is formed as about 70 Å and the width of the edge portion of the first case is formed as about 3.6 μm, and a case a4 in which the depth of the edge portion of the first case is formed as about 70 Å and the width of the edge portion of the first case is formed as about 4.0 μm in the present experimental example of the conventional art, are measured and shown in FIG. 22. In addition, a waveform change with respect to a frequency of S11 (dB) for a case b1 in which a depth of the first edge portion EP1 of the second case in which the edge portion EP including the first edge portion EP1 and the second edge portion EP2 having different heights is formed is formed as about 50 Å, a depth of the second edge portion EP2 of the second case is formed as about 130 Å, and a width of the edge portion EP of the second case is formed as about 2.8 μm and a case b2 in which the depth of the first edge portion EP1 of the second case is formed as about 50 Å, the depth of the second edge portion EP2 of the second case is formed as about 130 Å, and the width of the edge portion EP of the second case is formed as about 3.2 μm in the present experimental example of the bulk acoustic resonators according to the above-described embodiments, are measured and shown in FIG. 23.

In FIGS. 22 and 23, S11 of a y-axis is a reflection coefficient in an S-Parameter, and the smaller an absolute value of the reflection coefficient (the closer to 0 of the y-axis), the smaller a loss.

Referring to FIG. 22, in the first case where one edge portion is formed at the edge of the central portion of the conventional art, performance of the case a2 in which the width of the edge portion is formed as about 3.2 μm may be the best, spurious noise SN may be slightly increased in the case a1 in which the width of the edge portion is formed as about 2.8 μm, and a notch may be increased in the case a3 in which the width of the edge portion is formed as about 3.6 μm.

Referring to FIG. 23, in the second case where the edge portion EP including the first edge portion EP1 and the second edge portion EP2 having different heights is formed of the bulk acoustic resonators according to the above-described embodiments, performance of the case b1 in which the width of the edge portion EP is formed as about 2.8 μm may be the best, and a notch may occur in the case b2 in which the width of the edge portion EP is formed as about 3.2 μm.

Referring to FIGS. 22 and 23 together, spurious noise of the second case in which the edge portion EP including the first edge portion EP1 and the second edge portion EP2 having different heights is formed of the bulk acoustic resonators according to the above-described embodiments is much better relative to that of the first case where one edge portion is formed at the edge of the central portion of the conventional art.

Additional experimental examples will be described with reference to FIGS. 24 to 29. FIGS. 24 to 29 are graphs showing results of the additional experimental examples.

When a width of the edge portion is about 2.2 μm and a depth of the edge portion is about 120 Å in the first case where one edge portion is formed at the edge of the central portion according to the present experimental example of the conventional art, the first case may have optimal efficiency. In this case, spurious noise that is a value of a sum of the reflection coefficients S11 of the S-parameter according to a change in a width EPW of the edge portion EP and a notch that is a value of the S11 at a portion where a size of the S11 rapidly increases for a case c1 in which the height difference is formed as about 50 Å, a case c2 in which the height difference is formed as about 70 Å, a case c3 in which the height difference is formed as about 90 Å, a case c4 in which the height difference is formed as about 110 Å, a case c5 in which the height difference is formed as about 130 Å, or a case c6 in which the height difference is formed as about 150 Å, are measured and shown in FIGS. 24 and 25.

In addition, when the width of the edge portion EP is about 3.0 μm, the height difference regarding the first edge portion EP1 is about 60 Å, and the height difference regarding the second edge portion EP2 is about 140 Å in the second case in which the edge portion EP including the first edge portion EP1 and the second edge portion EP2 having different heights is formed according to the present experimental example of the bulk acoustic resonators according to the above-described embodiments, the second case may have optimal efficiency. In this case, spurious noise that is a value of a sum of the reflection coefficients S11 of the S-parameter according to a change in a width of the edge portion EP and a notch that is a value of the S11 at a portion where a size of the S11 rapidly increases for a case d1 in which the height differences regarding the first edge portion EP1 and the second edge portion EP2 are about 30 Å and about 110 Å, a case d2 in which the height differences regarding the first edge portion EP1 and the second edge portion EP2 are about 60 Å and about 130 Å, or a case d3 in which the height differences regarding the first edge portion EP1 and the second edge portion EP2 are about 70 Å and about 150 Å, are measured and shown in FIGS. 26 and 27.

Figure 28:
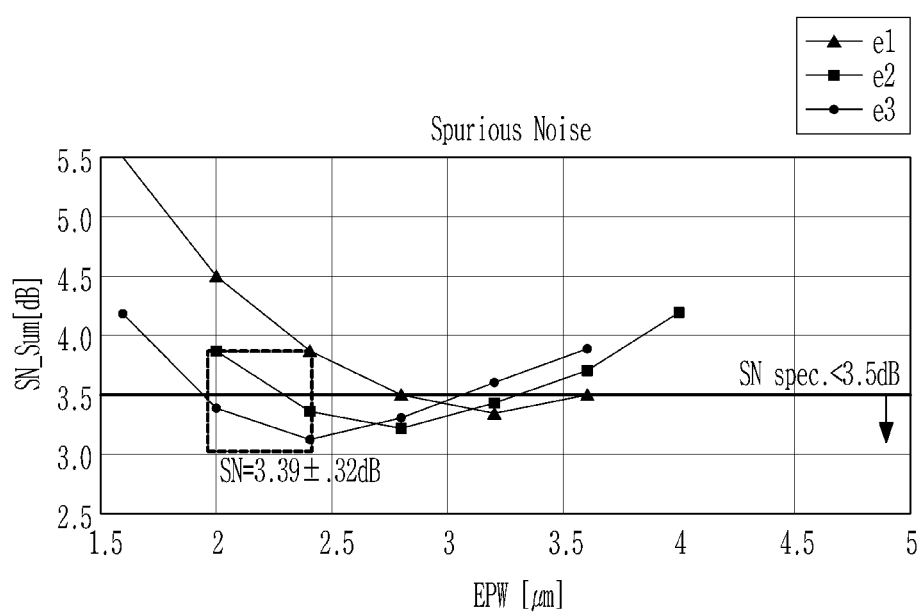
Figure 29:
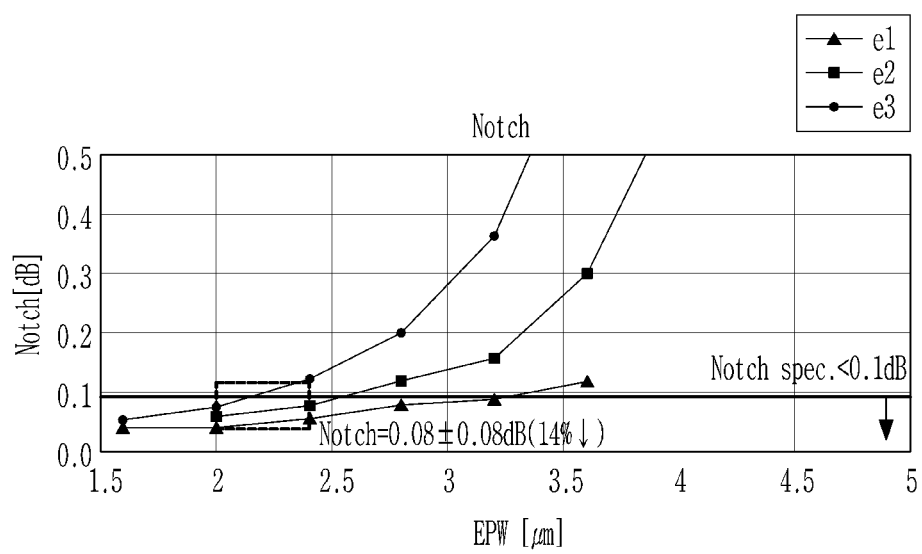

In addition, FIGS. 28 and 29 show results when the height differences regarding the first edge portion EP1 and the second edge portion EP2 are about 40 Å. In this case, when the width of the edge portion EP is about 2.2 μm, the height difference regarding the first edge portion EP1 is about 100 Å, and the height difference regarding the second edge portion EP2 is about 140 Å, the second case may have optimal efficiency. In this case, spurious noise that is a value of a sum of the reflection coefficients S11 of the S-parameter according to a change in a width of the edge portion EP and a notch that is a value of the S11 at a portion where a size of the S11 rapidly increases for a case e1 in which the height differences regarding the first edge portion EP1 and the second edge portion EP2 are about 70 Å and about 110 Å, a case e2 in which the height differences regarding the first edge portion EP1 and the second edge portion EP2 are about 90 Å and about 130 Å, and a case e3 in which the height differences regarding the first edge portion EP1 and the second edge portion EP2 are about 110 Å and about 150 Å, are measured and shown in FIGS. 28 and 29.

Figure 24:
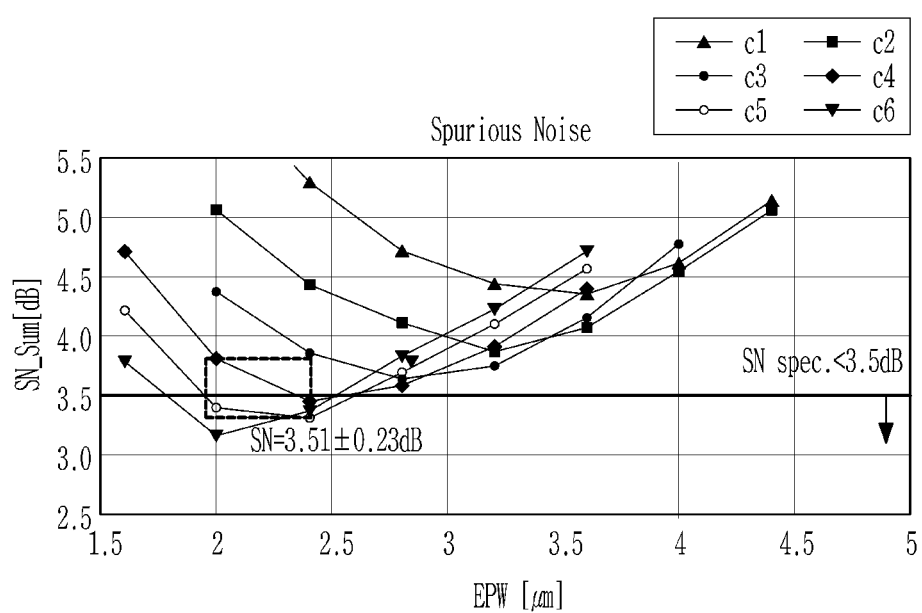
FIGS. 24 to 29 are graphs showing results of additional experimental examples.
Figure 25:
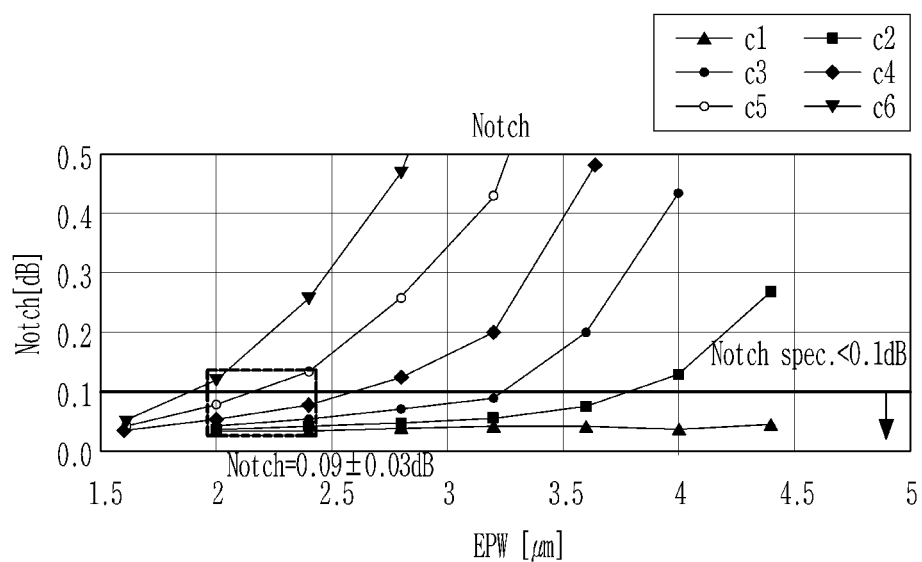
Figure 26:
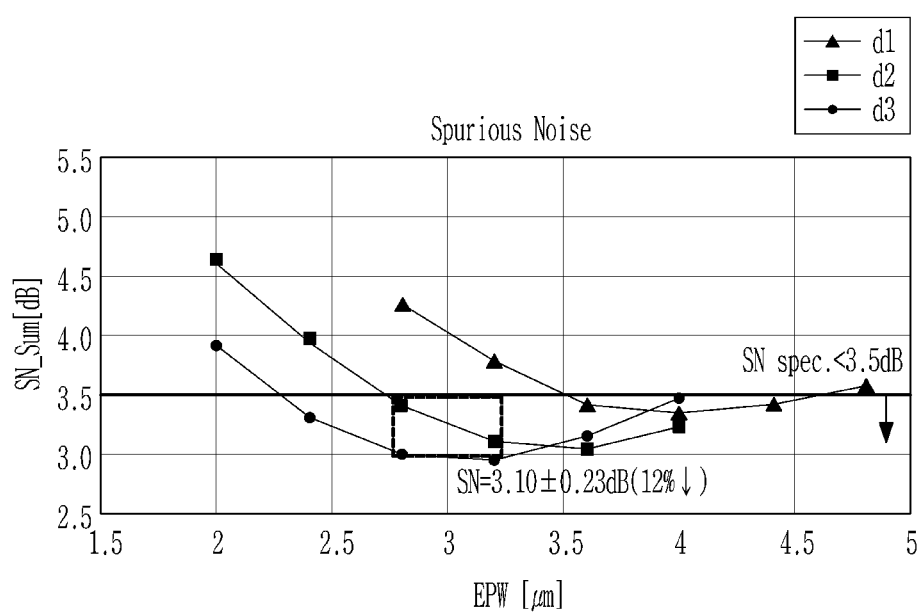
Figure 27:
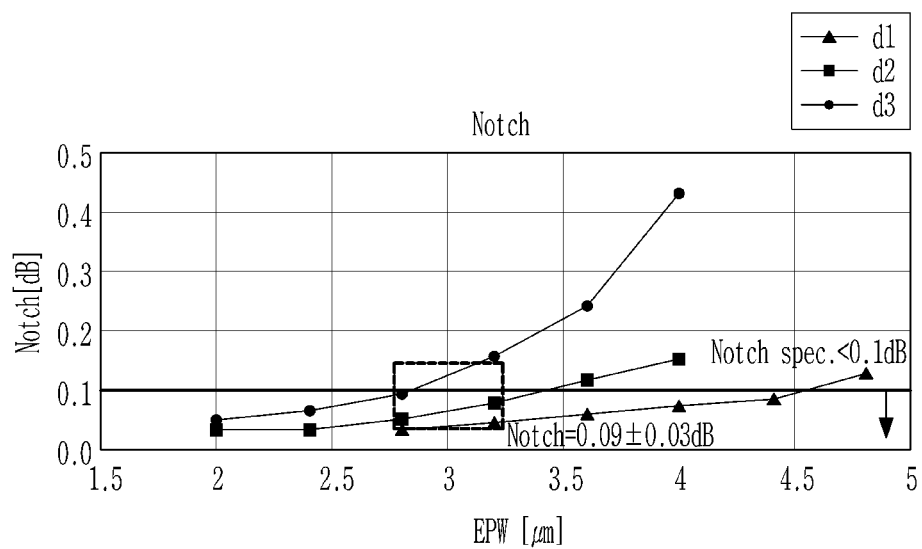

In FIGS. 24 to 29, an x-axis has a value of the width of the edge portion, in FIGS. 24, 26, and 28, a y-axis has the value of the sum of the reflection coefficients S11 of the S-parameter, and in FIGS. 25, 27, and 29, a y-axis is the value of the S11 at the portion where the size of the S11 rapidly increases.

Referring to FIGS. 24 and 25, when a manufacturing process error in which the height difference regarding the edge portion changes by about ±10 Å and the width of the edge portion changes by about ±0.2 μm occurs in the first case where one edge portion is formed at the edge of the central portion of the conventional art, as shown in a box, a change size of the spurious noise SN may become 3.51±0.23 dB and a change size of the notch Notch may become 0.09±0.03 dB so that the change size of the spurious noise SN is outside a level of about 3.5 dB or less and the change size of the notch Notch is outside a level of about 0.1 dB or less.

Referring to FIGS. 26 and 27 together with FIGS. 24 and 25, as shown in a box, even when, similar to the first case, a process error in which a change size of the spurious noise SN becomes 3.51±0.23 dB and a change size of the notch Notch becomes 0.09±0.03 dB occurs in the second case in which the edge portion EP including the first edge portion EP1 and the second edge portion EP2 having different heights is formed of the bulk acoustic resonators according to the above-described embodiments, it is possible to reduce the change size of the spurious noise SN by about 12% while maintaining the change size of the notch Notch compared with the first case. Therefore, even if the manufacturing process error in which the height difference regarding the edge portion changes by about ±10 Å and the width of the edge portion changes by about ±0.2 μm occurs in the second case in which the edge portion EP including the first edge portion EP1 and the second edge portion EP2 having different heights is formed of the bulk acoustic resonators according to the above-described embodiments and the first case where one edge portion is formed at the edge of the central portion of the conventional art, the change size of the spurious noise SN may be outside the level of about 3.5 dB or less.

Thus, when the process error occurs at the edge portion EP, the change size of the spurious noise SN of the second case in which the edge portion EP including the first edge portion EP1 and the second edge portion EP2 having different heights is formed of the bulk acoustic resonators according to the above-described embodiments may be relatively small compared to that of the first case where one edge portion is formed at the edge of the central portion of the conventional art.

Referring to FIGS. 28 and 29 together with FIGS. 24 and 25, even if, as shown in a box, the manufacturing process error in which the height difference regarding the edge portion changes by about ±10 Å and the width of the edge portion changes by about ±0.2 μm occurs in the second case in which the edge portion EP including the first edge portion EP1 and the second edge portion EP2 having different heights is formed of the bulk acoustic resonators according to the above-described embodiments, a change size of the spurious noise SN may become 3.39±0.32 dB and a change size of the notch Notch may become 0.08±0.02 dB. Thus, even if the manufacturing process error in which the height difference regarding the edge portion changes by about ±10 Å and the width of the edge portion changes by about ±0.2 μm occurs in the second case in which the edge portion EP including the first edge portion EP1 and the second edge portion EP2 having different heights is formed of the bulk acoustic resonators according to the above-described embodiments and the first case where one edge portion is formed at the edge of the central portion of the conventional art, the change size of the spurious noise SN may be similar, but the change size of the notch Notch may be reduced by about 14%. Therefore, even if the manufacturing process error in which the height difference regarding the edge portion changes by about ±10 Å and the width of the edge portion changes by about ±0.2 μm occurs in the second case in which the edge portion EP including the first edge portion EP1 and the second edge portion EP2 having different heights is formed of the bulk acoustic resonators according to the above-described embodiments and the first case where one edge portion is formed at the edge of the central portion of the conventional art, the change size of the notch Notch may be outside the level of about 0.1 dB or less.

Thus, when the process error occurs at the edge portion EP, the change size of the notch Notch of the second case in which the edge portion EP including the first edge portion EP1 and the second edge portion EP2 having different heights is formed of the bulk acoustic resonators according to the above-described embodiments may be relatively small compared to that of the first case where one edge portion is formed at the edge of the central portion of the conventional art.

According to the embodiments as described herein, a bulk acoustic resonator capable of preventing leakage of resonance energy due to a lateral wave may be provided.

While specific examples have been shown and described above, it will be apparent after an understanding of this disclosure that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk acoustic resonator, comprising a resonance portion including a first electrode, a piezoelectric layer disposed on the first electrode along a height direction, and a second electrode disposed on the piezoelectric layer along the height direction,
   wherein the resonance portion comprises an overlapping region in which the first electrode, the piezoelectric layer, and the second electrode overlap each other along the height direction,
   wherein the overlapping region comprises a central portion disposed in a center of the resonance portion and an edge portion disposed outside the central portion,
   wherein the edge portion comprises a first edge portion and a second edge portion,
   wherein a height of the second electrode of the first edge portion and a height of the second electrode of the second edge portion are lower than a height of the second electrode of the central portion along the height direction, and
   wherein the height of the second electrode of the first edge portion and the height of the second electrode of the second edge portion are different from each other along the height direction.

2. The bulk acoustic resonator of claim 1,
   wherein the height of the second electrode of the central portion is substantially constant,
   wherein the first edge portion is disposed closer to the central portion than the second edge portion, and
   wherein the height of the second electrode of the first edge portion is greater than the height of the second electrode of the second edge portion.

3. The bulk acoustic resonator of claim 2,
   wherein a thickness of the second electrode of the central portion is greater than each of a thickness of the second electrode of the first edge portion and a thickness of the second electrode of the second edge portion.

4. The bulk acoustic resonator of claim 3,
   wherein the thickness of the second electrode of the first edge portion is greater than the thickness of the second electrode of the second edge portion.

5. The bulk acoustic resonator of claim 2,
   wherein a thickness of the piezoelectric layer of the central portion is greater than each of a thickness of the piezoelectric layer of the first edge portion and a thickness of the piezoelectric layer of the second edge portion.

6. The bulk acoustic resonator of claim 5,
   wherein the thickness of the piezoelectric layer of the first edge portion is greater than the thickness of the piezoelectric layer of the second edge portion.

7. The bulk acoustic resonator of claim 2,
   wherein a thickness of the first electrode of the central portion is greater than each of a thickness of the first electrode of the first edge portion and a thickness of the first electrode of the second edge portion.

8. The bulk acoustic resonator of claim 7,
   wherein the thickness of the first electrode of the first edge portion is greater than the thickness of the first electrode of the second edge portion.

9. The bulk acoustic resonator of claim 2,
   wherein the edge portion further comprises a protruding portion disposed outside the second edge portion, and
   wherein a height of the second electrode of the protruding portion is higher than a height of the second electrode of the central portion along the height direction.

10. The bulk acoustic resonator of claim 9,
    wherein the edge portion further comprises an inclined portion disposed between the protruding portion and the second edge portion, and
    wherein a height of the inclined portion gradually increases from the height of the second electrode of the second edge portion to the height of the second electrode of the protruding portion along the height direction.

11. The bulk acoustic resonator of claim 9,
    wherein a thickness of the second electrode of the central portion is greater than each of a thickness of the second electrode of the first edge portion and a thickness of the second electrode of the second edge portion,
    wherein the thickness of the second electrode of the first edge portion is greater than the thickness of the second electrode of the second edge portion, and
    wherein a thickness of the second electrode of the protruding portion is greater than the thickness of the second electrode of the central portion.

12. The bulk acoustic resonator of claim 9,
    wherein a thickness of the first electrode of the central portion is greater than each of a thickness of the first electrode of the first edge portion and a thickness of the first electrode of the second edge portion,
    wherein the thickness of the first electrode of the first edge portion is greater than the thickness of the first electrode of the second edge portion, and
    wherein a thickness of the first electrode of the protruding portion is greater than the thickness of the first electrode of the central portion.

13. The bulk acoustic resonator of claim 9, further comprising
    an insertion layer overlapping the protruding portion along the height direction.

14. The bulk acoustic resonator of claim 13,
wherein an end portion of the insertion layer comprises an inclined surface, and
wherein the protruding portion comprises a surface inclined along the inclined surface of the insertion layer.

15. The bulk acoustic resonator of claim 13, wherein the insertion layer is disposed between the piezoelectric layer and the second electrode.

16. The bulk acoustic resonator of claim 13, wherein the insertion layer is disposed within the piezoelectric layer.

17. The bulk acoustic resonator of claim 13, wherein the insertion layer is disposed between the first electrode and the piezoelectric layer.

18. The bulk acoustic resonator of claim 9, wherein the edge portion further comprises a third edge portion disposed between the second edge portion and the protruding portion, and
a height of the second electrode of the third edge portion is lower than the height of the second electrode of the second edge portion along the height direction.

19. The bulk acoustic resonator of claim 18, wherein a thickness of the second electrode of the central portion is greater than a thickness of the second electrode of the edge portion,
a thickness of the second electrode of the first edge portion is greater than a thickness of the second electrode of the second edge portion, and
the thickness of the second electrode of the second edge portion is greater than a thickness of the second electrode of the third edge portion.

20. The bulk acoustic resonator of claim 18, further comprising an insertion layer overlapping the protruding portion along the height direction,
wherein a thickness of the second electrode of the protruding portion is substantially the same as a thickness of the second electrode of the central portion.

21. The bulk acoustic resonator of claim 1, wherein the first edge portion is disposed closer to the central portion than the second edge portion,
the height of the second electrode of the first edge portion is greater than the height of the second electrode of the second edge portion, and
the height of the second electrode of the first edge portion gradually decreases from the height of the second electrode of the central portion to the height of the second electrode of the second edge portion.

22. A bulk acoustic resonator, comprising:
a resonance portion comprising a first electrode, a piezoelectric layer disposed on the first electrode along a height direction, and a second electrode disposed on the piezoelectric layer along the height direction; and
an insertion layer that at least partially overlaps the resonance portion,
wherein:
the resonance portion comprises an overlapping region in which the first electrode, the piezoelectric layer, and the second electrode overlap each other along the height direction,
the overlapping region comprises a central portion disposed in a center of the resonance portion and an edge portion disposed outside the central portion,
the edge portion comprises a first edge portion, a second edge portion, and a protruding portion,
a height of the second electrode of the first edge portion and a height of the second electrode of the second edge portion are lower than a height of the second electrode of the central portion along the height direction,
a height of the second electrode of the protruding portion is higher than the height of the second electrode of the central portion along the height direction,
the height of the second electrode of the first edge portion and the height of the second electrode of the second edge portion are different from each other along the height direction, and
the insertion layer overlaps the protruding portion along the height direction.

23. The bulk acoustic resonator of claim 22, wherein an end of the insertion layer comprises an inclined surface, and
the protruding portion comprises a surface inclined along the inclined surface of the insertion layer.

24. The bulk acoustic resonator of claim 23, wherein a height of the second electrode of the surface inclined along the inclined surface of the insertion layer increases along the height direction as the second electrode extends away from the central portion.

25. A bulk acoustic resonator, comprising:
an overlapping region in which a first electrode, a piezoelectric layer, and a second electrode overlap each other along a height direction,
wherein the overlapping region comprises a central portion and an edge portion disposed outside the central portion,
wherein the edge portion comprises a first edge portion and a second edge portion disposed outside the first edge portion,
wherein a height of the second electrode of the first edge portion is lower than a height of the second electrode of the central portion along the height direction, and
wherein the height of the second electrode of the second edge portion is lower than the height of the second electrode of the first edge portion along the height direction.

26. The bulk acoustic resonator of claim 25, wherein a height difference among the second electrode of the central portion, the second electrode of the first edge portion, and the second electrode of the second edge portion is due to thickness differences of one or more of the second electrode, the piezoelectric layer, and the first electrode among the central portion, the first edge portion, and the second edge portion.

27. The bulk acoustic resonator of claim 25, further comprising a protruding portion disposed outside the second edge portion,
wherein a height of the second electrode of the protruding portion is higher than the height of the second electrode of the central portion along the height direction.

28. The bulk acoustic resonator of claim 27, further comprising an insertion layer disposed between the first electrode and the second electrode in the overlapping region,
wherein the insertion layer overlaps the protruding portion along the height direction.

29. The bulk acoustic resonator of claim 28, wherein an end of the insertion layer comprises an inclined surface,
the protruding portion comprises a surface inclined along the inclined surface of the insertion layer, and
a height of the second electrode of the surface inclined along the inclined surface of the insertion layer increases along the height direction as the second electrode extends away from the central portion.

30. The bulk acoustic resonator of claim 25, wherein the overlapping region constitutes a resonance portion, and one or more of the edge portion and the protruding portion is configured to prevent resonance energy generated in the central portion from being leaked to the outside.

\* \* \* \* \*